(12) United States Patent
Okada et al.

(10) Patent No.: US 6,605,353 B2
(45) Date of Patent: Aug. 12, 2003

(54) EPOXY-MODIFIED POLYIMIDE, PHOTOSENSITIVE COMPOSITION, COVERLAY FILM, SOLDER RESIST, AND PRINTED WIRING BOARD USING THE EPOXY-MODIFIED POLYIMIDE

(75) Inventors: Koji Okada, Otsu (JP); Hitoshi Nojiri, Otsu (JP); Shoji Hara, Yokohama (JP)

(73) Assignee: Kaneka Corporation, Osaka (JP)

( * ) Notice: Subject to any disclaimer, the term of this patent is extended or adjusted under 35 U.S.C. 154(b) by 134 days.

(21) Appl. No.: 09/749,607

(22) Filed: Dec. 28, 2000

(65) Prior Publication Data

US 2001/0056174 A1 Dec. 27, 2001

(30) Foreign Application Priority Data

Dec. 28, 1999 (JP) .............................. 11-373681
Mar. 7, 2000 (JP) ........................ 2000-062319
Mar. 24, 2000 (JP) ........................ 2000-084769

(51) Int. Cl.⁷ ............................... B32B 27/38
(52) U.S. Cl. ................. 428/413; 428/418; 428/901; 428/473.5; 525/423; 427/386
(58) Field of Search ............... 428/413, 901, 428/418, 473.5; 525/423; 427/386

(56) References Cited

U.S. PATENT DOCUMENTS

| 5,643,986 A | 7/1997 | Ishikawa et al. |
| 5,677,393 A | 10/1997 | Ohmori et al. |
| 5,739,263 A | 4/1998 | Yoshida et al. |
| 5,773,509 A | 6/1998 | Yoshida et al. |
| 6,117,510 A | 9/2000 | Ishikawa et al. |

OTHER PUBLICATIONS

Abstract, JP 05009366, Kyohara, Jan. 19, 1993.*
Abstract, JP 11335555, Saito et al., Dec. 7, 1999.*

* cited by examiner

Primary Examiner—Robert Dawson
Assistant Examiner—Christopher M. Keehan
(74) Attorney, Agent, or Firm—Fitch, Even, Tabin & Flannery

(57) ABSTRACT

An object of the present invention is to provide an epoxy modified polyimide, which is a resin capable of treating at a low processing temperature and having an excellent heat resistance; photosensitive composition; coverlay film, which is excellent in electrical insulation property, heat resistance for soldering, film-formability, flexibility, and chemical resistance; solder resist; and printed wiring board. The epoxy modified polyimide is obtained by synthesizing polyimide having a hydroxy group or carboxy group and subsequently reacting the polyimide with an epoxy compound. The photosensitive composition is obtained by adding a photoreaction initiator or the like to the epoxy modified polyimide. The coverlay film and the solder resist can be formed from the photosensitive composition. The printed wiring board is produced using the coverlay film and the solder resist.

20 Claims, 1 Drawing Sheet

EPOXY-MODIFIED POLYIMIDE, PHOTOSENSITIVE COMPOSITION, COVERLAY FILM, SOLDER RESIST, AND PRINTED WIRING BOARD USING THE EPOXY-MODIFIED POLYIMIDE

BACKGROUND OF THE INVENTION

1. Field of the Invention

The present invention relates to an epoxy-modified polyimide, and an innovative photosensitive composition and a printed wiring board using the epoxy-modified polyimide and more specifically relates to an epoxy-modified polyimide to be used especially in electronic material field, its production method, as well as a photosensitive composition containing the epoxy-modified polyimide and a photoreaction initiator and excellent in heat resistance, chemical resistance, an insulating property, and flexibility, a material for an electric wiring board using the polyimide, especially, a solder protection film (a solder resist), a coverlay film, and a printed wiring board.

2. Description of the Prior Art

Recently, electronic apparatuses have rapidly been made multifunctional and high-performance and miniaturized and following that, electronic parts are required to be miniaturized and made light weight. For that, as compared with a common rigid printed wiring board as a wiring board to mount electronic parts thereon, a flexible printed wiring board (hereafter referred to as FPC) excellent in flexibility has drawn more attention than ever and the demand has sharply been increased.

Meanwhile, a polymer film, so-called a coverlay film, is stuck to the surface of a FPC for the purpose of protecting the conductor face. A method employed as a method for laminating the coverlay film onto the surface of the conductor face is generally carried out by overlaying the coverlay film processed to have a prescribed shape and bearing an adhesive in one side to a FPC, properly positioning them, and then thermally laminating them each other by pressing or the like. However, the adhesive employed for that case is mainly an epoxy type or acrylic type adhesive or the like and in the case of using such an adhesive, there is a problem that the heat resistance for soldering or the heat resistance of the adhesion strength at a high temperature is low and that the flexibility is inferior and the function of the coverlay film as a base film has not sufficiently been utilized.

Further, in the case a coverlay film is stuck to a FPC using a conventional epoxy or acrylic adhesive before the laminating, it is required for the coverlay film to be processed to form holes and windows positioned at terminal parts of a circuit and junctions of constituent parts. However, not only it is difficult to form holes or the line in a thin coverlay film but also it is required to carry out the positioning conformation of the holes or the like of the coverlay film to the terminal parts of the circuit and junctions of the constituent parts of the FPC almost though a manual work and thus the workability and the positioning precision have been low and the cost has been high.

In order to improve the workability and the positioning precision, a method for forming a protection layer on a conductor face by applying a photosensitive composition and a photosensitive coverlay film (also called as a photosensitive dry film resist) have been developed and the workability and the positioning precision have been improved.

Nevertheless, for the foregoing coverlay film, acrylic type resins have been used and they are insufficient in the heat resistant temperature and brittleness as a film. From the view of improving the heat resistance and the mechanical strength as a film, a photosensitive polyimide has, therefore, been required to be used. Subsequently, there have been developed photosensitive polyimides into which methacryloyl group is introduced with the ester bond linkaged (Japanese examined Patent Publication No. 55-030207, Japanese examined Patent Publication No. 55-041422) and photosensitive polyimides into which amine compounds or diisocyanate compounds having methacryloyl group are introduced in the carboxy group part of the polyamide acid (Japanese unexamined Patent Publication No. 54-145794, Japanese unexamined Patent Publication No. 59-160140, Japanese unexamined Patent Publication No. 03-170547, Japanese unexamined Patent Publication No. 03-186847, Japanese unexamined Patent Publication No. 61-118424).

However, since those photosensitive polyimides are processed to be converted into polyimides by layering them in polyamide acid state on a FPC, exposing and developing the resultant layer, and then carrying out imidation for the layer, the FPC has to be heated to 250° C. or higher for the imidation reaction. Further, for some photosensitive polyimides, the acryloyl group has to be removed by heat and during the removal process, there occurs a problem that the film thickness is significantly lessened.

As a photosensitive polyimide which does not require the heat treatment at a high temperature after exposure and development, a method was proposed (Japanese unexamined Patent Publication Number 59-108031) which comprises steps of previously synthesizing a diamine having a carbon—carbon double bond, causing reaction of the diamine with an acid dianhydride to obtain a polyamide acid, and causing imidation of the resultant polyamide acid to use the obtained compound as a photosensitive resin. In this case, since the imidation is carried out before the exposure and development, it is no need to carry out heat treatment at a high after the exposure and development.

However, by the method proposed in the Japanese unexamined Patent Publication Number 59-108031, it is difficult to produce the diamine compound having a carbon—carbon double bond at high yield. The reason why is that when a dinitro compound having a carbon—carbon double bond, from which the diamine compound is generally produced by reduction, is reduced, the carbon—carbon double bond also tends to be reduced. Subsequently, the problem caused is that the yield is lowered and therefore the diamine compound having a carbon—carbon double bond inevitably becomes expensive.

In addition to that, the formation process of a solder protection film (e.g. a solder resist) is almost essential one in the printed wiring board manufacture. As a solder resist for a printed wiring board for industrial use, there conventionally used are thermosetting type solder resist compositions of alkyd/melamine resins, epoxy/melamine resin, two-part epoxy resins, and the likes, and these thermosetting solder resists are applied to the surface of a printed wiring board by printing or other methods and then hardened by heating to form a protection film.

However, those conventionally used solder resists require a relatively long time and high temperature for hardening by heating after application to be lower the productivity and cause a problem that substrate warping and shrinking easily occurs owing to the high heat hardening temperature. For the purpose of solving those problems, ultraviolet ray (UV)-curable solder resists used for printed wiring boards for consumer use have been studied and, in spite of that, found the properties are not satisfactory. Moreover, for printed wiring boards for industrial use, the conductor thickness of such as a copper foil has to be thicker, about 50 to 70 μm, as comparison consumer-use one having thickness of at most 60 μm, usually 40 μm, and a industrial-use solder resist has to be applied to be thick. On the contrary, a UV-curable solder resist for consumer use has a problem in the hardenability in case of a thick film and has to be thin. Nevertheless, if the thickness of the solder resist is made thin, there occurs a problem that the insulation property and the heat resistance for soldering which are required for printed wiring boards for industrial use become unsatisfactory and the reliability is deteriorated.

Furthermore, in the case of a flexible printed wiring board not only for industrial use but also for consumer use, additionally to the foregoing reliability, excellent film-formability and flexibility are required and hence conventional thermosetting and UV-curable solder resists are unsatisfactory. Subsequently, a photosensitive solder resist is desired o be developed for the use of a printed wiring board and a flexible printed wiring board for industrial use.

BRIEF SUMMARY OF THE INVENTION

Taking the foregoing circumstances into consideration, the present invention has been developed to provide a photosensitive composition capable of forming a protection film excellent in electric insulation property, heat resistance for soldering, film-formability, flexibility, and chemical resistance and further to provide a coverlay film, a solder resist, and a printed wiring board using the composition and to provide their production methods.

Hence investigation has been performed for the purpose of solving the foregoing conventional problems and providing an economical photosensitive polyimide having sufficiently high mechanical strength and excellent in heat resistance and further in the workability, adhesion strength and especially in low moisture-adsorption property.

More specifically, the present invention provides a method for freely producing a polyimide having a variety of functional groups not limited to a carbon—carbon double bond by modifying polyimide having hydroxy groups and carboxy groups with an epoxy compound and the production method has been found possible to solve the above described objects. That is, an epoxy-modified polyimide of the present invention can be produced by a production method wherein a polyimide having carboxy groups or hydroxy groups is obtained and then the polyimide is reacted with an epoxy compound having two or more epoxy groups or an epoxy compound having an epoxy group together with a carbon—carbon double bond or an epoxy group and a carbon—carbon triple bond.

An epoxy-modified polyimide comprises at least 1% by weight of a structural unit represented by the general formula (1):

General formula (1)

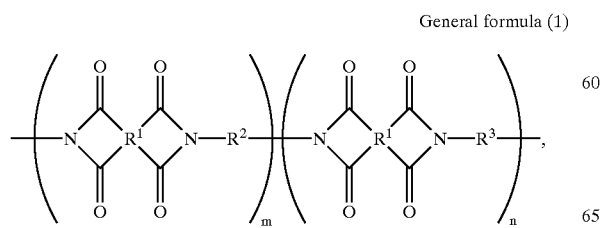

wherein $R^1$ is a tetravalent organic group;

$R^3$ is a divalent organic group; and $R^2$ is a monovalent organic group containing one to four organic groups selected from the group consisting of:

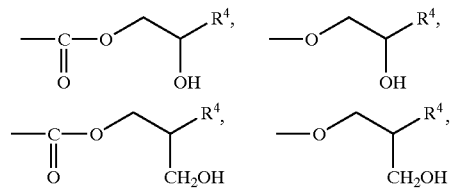

wherein $R^4$ is a monovalent organic group having at least one selected from the group consisting of an epoxy group, a carbon—carbon double bond, and a carbon—carbon triple bond;

m is an integer of one or more; and n is an integer of 0 or more.

In the general formula (1), $R^1$ may be at least one tetravalent organic group containing one to three aromatic rings or alicyclic group.

In the general formula (1), $R^3$ may be a diamine residue containing at least one of a carboxy group and a hydroxy group.

In the general formula (1), $R^1$ may be a residue of acid dianhydride containing at least 10 mol % of acid dianhydride selected from the group (I):

Group (I)

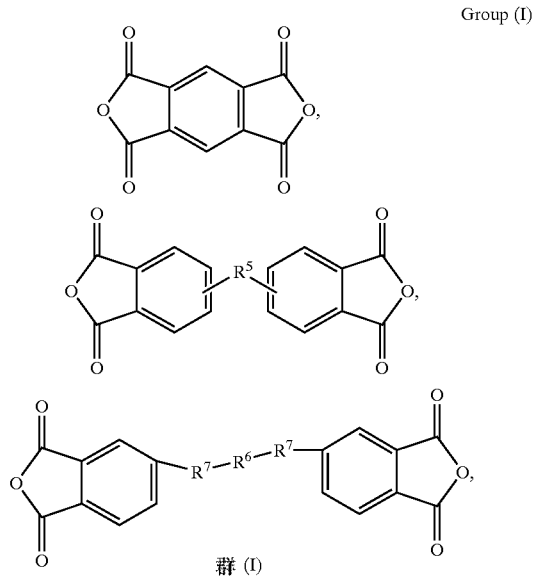

群 (I)

wherein $R^5$ represents —$C_6H_4$—, —$C(CF_3)_2$—, —CO—, —O—, and a single bond; $R^6$ is a divalent organic group selected from the group (II):

(II)

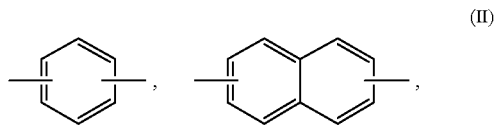

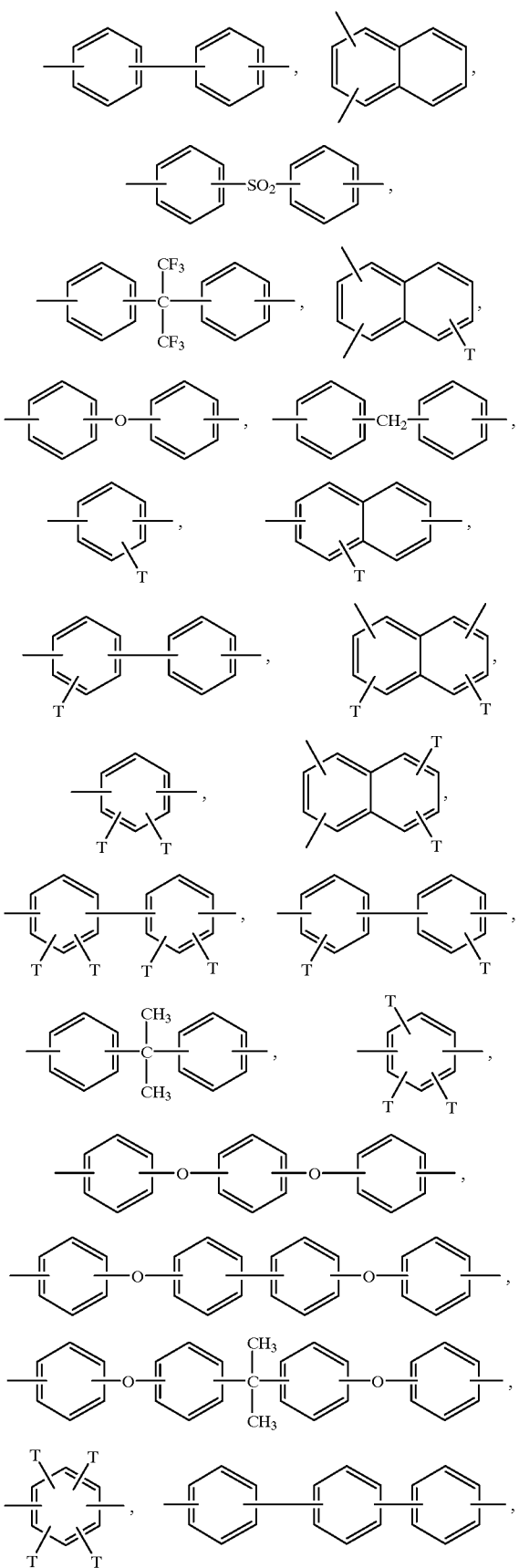

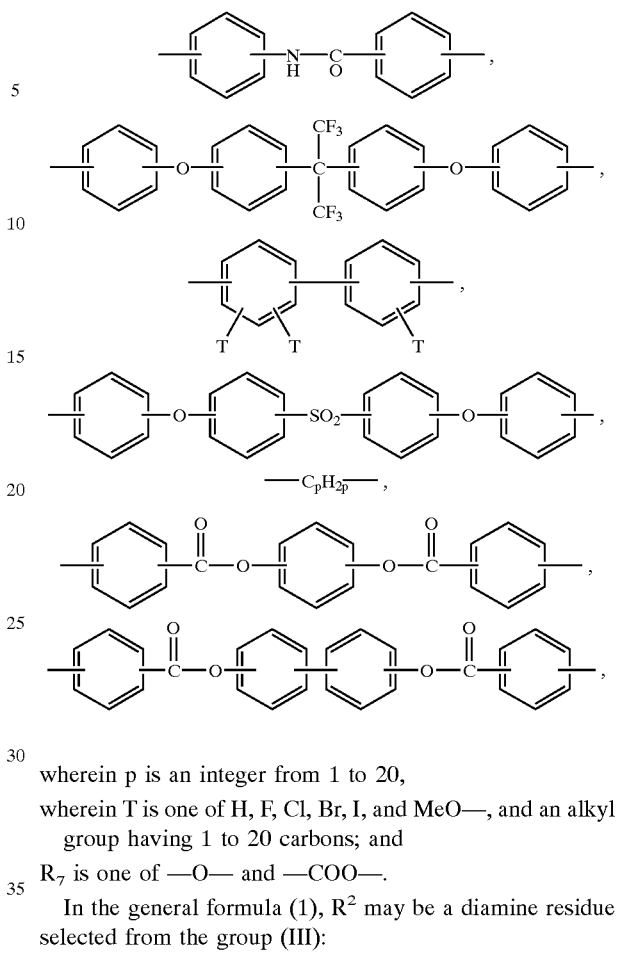

wherein p is an integer from 1 to 20,
wherein T is one of H, F, Cl, Br, I, and MeO—, and an alkyl group having 1 to 20 carbons; and
$R_7$ is one of —O— and —COO—.

In the general formula (1), $R^2$ may be a diamine residue selected from the group (III):

Group (III)

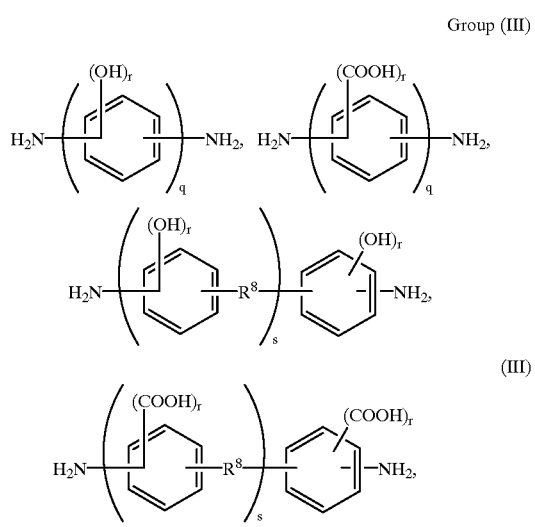

(III)

wherein q and s are an integer from 1 to 3; r is an integer from 1 to 4; and $R^8$ is a divalent organic group selected from the group consisting of —O—, —S—, —CO—, —CH$_2$—, —SO$_2$—, —C(CH$_3$)$_2$—, —C(CF$_3$)$_2$—, and —O—CH$_2$—C(CH$_3$)$_2$—CH$_2$—O—.

In the general formula (1), $R^3$ may be a diamine residue selected form the group (IV):

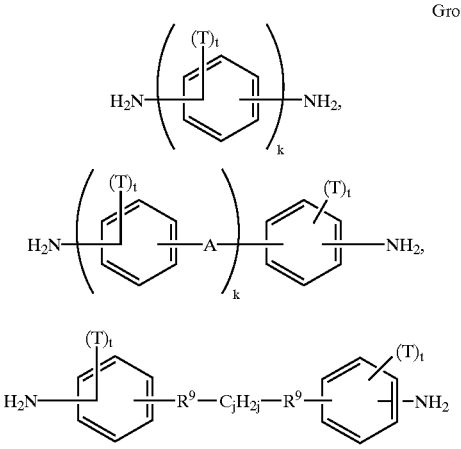

Group (IV)

(IV)

wherein T is one of H, F, Cl, Br, I, CH$_3$O—, and an alkyl group having 1 to 20 carbons;

A is one of —C(=O)—, —SO$_2$—, —O—, —S—, —(CH$_2$)$_m$—, —NHCO—, —C(CH$_3$)$_2$—, —C(CF$_3$)$_2$—, —C(=O)O—, —O—CH$_2$—C(CH$_3$)$_2$—CH$_2$—O—, and a bond;

R$^9$ is one of —O—, —C(=O)O—, —O(O=)C—, —SO$_2$—, —C(=O)—, —S—, —C(CH$_3$)$_2$—, and a bond;

k is an integer from 0 to 4;
t is an integer from 1 to 4; and
j is an integer from 1 to 20.

A method of producing an epoxy-modified polyimide comprises: reacting polyimide represented by the general formula (2):

General formula (2)

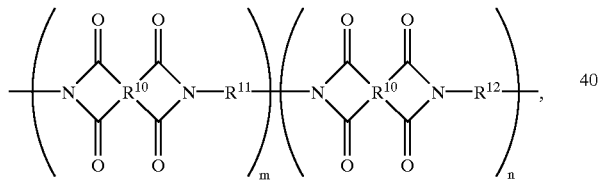

wherein R$^{10}$ is a tetravalent organic group; R$^{11}$ is a divalent organic group containing at least one of a carboxy group and a hydroxy group; R$^{12}$ is a divalent organic group; m is an integer of one or more; and n is an integer of 0 or more, with a compound selected from the group consisting of an epoxy compound containing at least two epoxy groups, a compound containing an epoxy group and a carbon—carbon double bond, and a compound containing an epoxy group and a carbon—carbon triple bond.

A glass transition temperature of the polyimide represented by the general formula (2) is 350° C. or less.

The method of producing an epoxy-modified polyimide further comprises: preparing polyamide acid by reacting diamine with acid dianhydride in an organic solvent when the polyimide represented by the general formula (2) is synthesized; and subsequently forming polyimide by heat drying the organic solvent solution of polyamide acid under a reduced pressure.

The drying temperature may be in a range form 80° C. to 400° C.

The drying pressure may be in a range from 0.09 to 0.0001 MPa.

A photosensitive composition comprises:

(A) an epoxy modified polyimide having a structural unit represented by the general formula (1):

General formula (1)

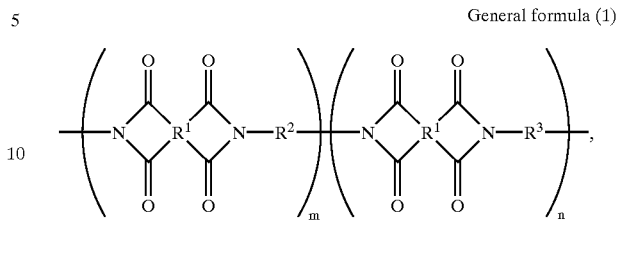

wherein R$^1$ is a tetravalent organic group; R$^3$ is a divalent organic group; and R$^2$ is a divalent organic group containing 1 to 4 organic groups selected from the group consisting of:

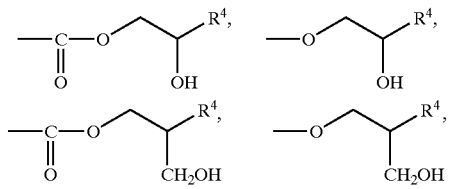

wherein R$^4$ is a monovalent organic group containing at least one selected from the group consisting of an epoxy group, a carbon—carbon double bond, and a carbon—carbon triple bond;

m is an integer of 1 or more; and
n is an integer of 0 or more, and (B) at least one of a photoreaction initiator and a sensitizer.

In another embodiment, a photosensitive composition comprises:

(A) an epoxy modified polyimide having a structural unit represented by at least the general formula (1):

General formula (1)

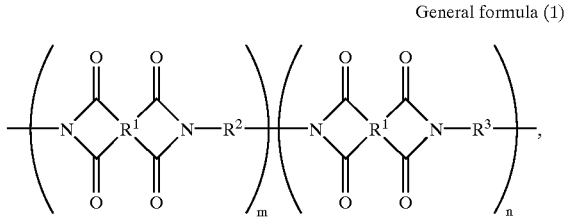

wherein R$^1$ is a tetravalent organic group; R$^3$ is a divalent organic group; and R$^2$ is a divalent organic group containing 1 to 4 organic groups selected from the group consisting of:

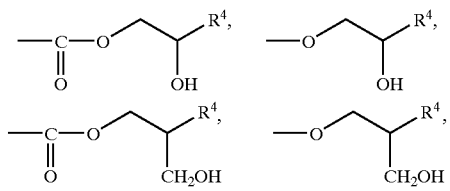

wherein R$^4$ is a monovalent organic group containing at least one selected from the group consisting of an epoxy group, a carbon—carbon double bond, and a carbon—carbon triple bond;

m is an integer of 1 or more; and
n is an integer of 0 or more, (B) at least one of a photoreaction initiator and a sensitizer, and (C) one of a reactive monomer or an oligomer containing a reactive carbon—carbon unsaturated bond.

A coverlay film according to the present invention consists essentially of the above-described photosensitive composition.

A solder resist according to the present invention consists essentially of the above-described photosensitive composition.

A printed wiring board according to the present invention comprises a solder resist made of the above-described photosensitive composition.

The printed wiring board according to the present invention includes at least one of a solder plating layer and a gold plating layer on a portion other than the coverlay film or the solder resist.

A method for producing a printed wiring board comprises: forming a protective layer by applying the above-described photosensitive composition onto a printed wiring board; and photo-curing the board.

A method of producing a printed wiring board comprises: forming a protective layer from a solder resist by applying the above-described photosensitive composition onto a printed wiring board and photo-curing the board; and applying solder plate or gold plate onto the portion other than the protective layer.

An epoxy-modified polyimide of the present invention provides an economical photosensitive composition excellent in heat resistance, adhesion strength, and chemical resistance and is useful for electronic material field, especially as an electric wiring board material. A production method of the present invention is easier than a conventional photosensitive polyimide production method and capable of introducing a variety of functional groups, increasing the yield, and improving the productivity. Further, a photosensitive composition containing an epoxy-modified polyimide of the present invention is preferably used for a coverlay film and a solder resist and a printed wiring board using thereof is excellent in heat resistance for soldering, chemical resistance, electric insulation property, and flexibility and a printed wiring board with high reliability required in the industrial electronic field can be manufactured.

BRIEF DESCRIPTION OF THE DRAWINGS

The present invention will hereinafter be described with reference to the accompanying drawings.

FIG. 2(a) shows a process of laying a coverlay film on a copper-clad laminated board with a circuit formed thereon after a protective film is peeled off from the coverlay film, FIG. 2(b) shows a process of laminating the coverlay film onto the laminated board under a heat pressure, FIG. 2(c) shows a process of exposing the board to light using a mask pattern, and FIG. 2(d) shows a process of developing the board after peeling a PET film from the board.

DETAILED DESCRIPTION

Figure 1:
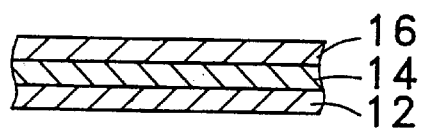
FIG. 1 is a schematic sectional view of a coverlay film according to the present invention.

An epoxy-modified polyimide of the present invention contains structural unit having a general formula (1)

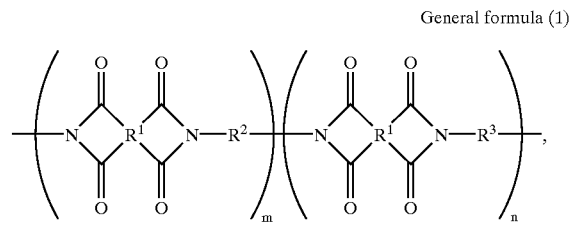

General formula (1)

wherein $R^1$ is a tetravalent organic group;

$R^3$ is a divalent organic group; and $R^2$ is a monovalent organic group containing one to four organic groups selected from the group consisting of:

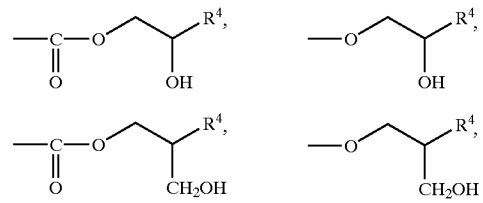

wherein $R^4$ is a monovalent organic group having at least one selected from the group consisting of an epoxy group, a carbon—carbon double bond, and a carbon—carbon triple bond;

m is an integer of one or more; and n is an integer of 0 or more; m/m+n=0.01 to 1, preferably 0.05 to 1, more preferably 0.1 to 1.)

Preferably, an epoxy-modified polyimide of the present invention contains structural unit having a general formula (1) of 1% by weight or more, more preferably 5% by weight or more, specially 10% by weight or more. If polyimide contains the structural unit having general formula (1) of less than 1% by weight, the photosensitive characteristics can not shown. If the more over 1% by weight polyimide contains a structural unit having general formula (1), the more noticeable the photosensitive characteristics is shown.

The epoxy-modified polyimide defined as the general formula (1) can be obtained by carrying out a reaction of a diamine component containing, as an essential component, a diamine compound having hydroxy groups or carboxy groups with an acid dianhydride component in an organic solvent to obtain a polyamide acid, then carrying out imidation of the resultant polyamide acid to obtain a polyimide containing hydroxy groups or carboxy groups, thereafter, carrying out a reaction of the obtained polyimide with an epoxy compound. Concretely, a polyimide containing hydroxy groups or carboxy groups represented by the formula (2)

General formula (2)

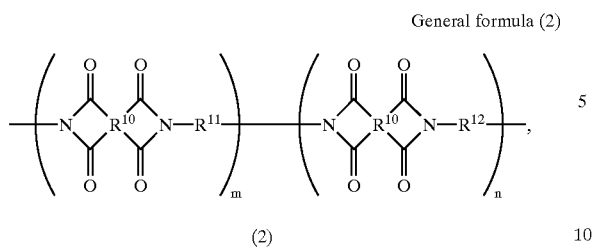

(2)

general formula (3)

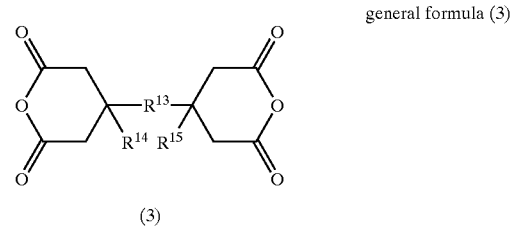

(3)

wherein $R^{10}$ is a tetravalent organic group; $R^{11}$ is a divalent organic group containing at least one of a carboxy group and a hydroxy group; $R^1$ is a divalent organic group; m is an integer of one or more; and n is an integer of 0 or more, is synthesized. And then, the produced polyimide is reacted.

An acid dianhydride to be employed for the polymerization in production of a polyamide acid is not particularly restricted as long as it is an acid dianhydride and, in terms of examples, it includes an aliphatic or alicyclic tetracarboxylic dianhydride such as 2,2'-hexafluropropylidene diphthalic acid dianhydride, 2,2-bis(4-hydroxyphenyl) propanedibenzoate-3,3',4,4'-tetracarboxylic acid dianhydride, butanetetracarboxylic acid dianhydride, 1,2,3,4-cyclobutanetetracarboxylic acid dianhydride, 1,3-dimethyl-1,2,3,4-cyclobutanetetracarboxylic acid dianhydride, 1,2,3,4-cyclopentanetetracarboxylic acid dianhydride, 2,3,5-tricarboxycyclopentylacetic acid dianhydride, 3,5,6-tricarboxynorbornane-2-acetic acid dianhydride, 2,3,4,5-tetrahydrofurantetracarboxylic acid dianhydride, 5-(2,5-dioxotetrahydrofuranyl)-3-methyl-3-cyclohexene-1,2-dicarboxylic acid dianhydride, bicyclo[2,2,2]-oct-7-ene-2,3,5,6-tetracarboxylic acid dianhydride, or the like; aromatic tetracarboxylic dianhydride such as pyromellitic acid dianhydride, 3,3',4,4'-benzophenonetetracarboxylic acid dianhydride, 3,3',4,4'-biphenylsulfonetetracarboxylic acid dianhydride, 1,4,5,8-naphthalenetetracarboxylic acid dianhydride, 2,3,6,7-naphthalenetetracarboxylic acid dianhydride, 3,3',4,4'-biphenyl ether tetracarboxylic acid dianhydride, 3,3',4,4'-dimethyldiphenylsilanetetracarboxylic acid dianhydride, 3,3',4,4'-tetraphenylsilanetetracarboxylic acid dianhydride, 1,2,3,4-furanetetracarboxylic acid dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy) diphenylpropane dianhydride, 3,3',4,4'-perfluoroisopropylidenediphthalic acid dianhydride, 3,3',4,4'-biphenyltetracarboxylic acid dianhydride, bis (phthalic acid)dianhydride phenylphosphine oxide, p-phenylene-bis(triphenylphthalic acid)dianhydride, m-phenylene-bis(triphenylphthalic acid)dianhydride, bis (triphenylphthalic acid)-4,4'-diphenyl ether dianhydride, bis (triphenylphthalic acid)-4,4'-diphenylmethane dianhydride, or the like; 1,3,3a,4,5,9b-hexahydro-2,5-dioxo-3-furanyl)-naphtho-[1,2-c]furan-1,3-dione, 1,3,3a,4,5,9b-hexahydro-5-methyl-5-(tetrahydro-2,5-dioxo-3-furanyl)-naphtho-[1,2-c] furan-1,3-dione, 1,3,3a,4,5,9b-hexahydro-8-methyl-5-(tetrahydro-2,5-dioxo-3-furayl)-naphtho-[1,2-c]furan-1,3-dione, a compound defined as the following general formula (3)

(wherein $R^{13}$ represents a bivalent organic group having an aromatic ring and $R^{14}$ and $R^{15}$ separately represent hydrogen atom or an alkyl,), and a compound defined as the following general formula (4)

general formula (4)

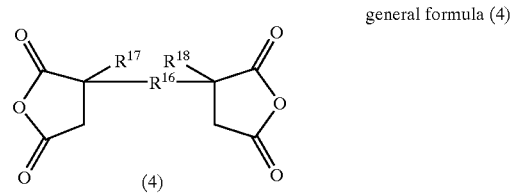

(4)

(wherein $R^{16}$ represents a bivalent organic group having an and aromatic ring and $R^{17}$ and $R^{18}$ separately denote hydrogen atom or an alkyl,).

Among them, from a viewpoint of heat resistance, a tetracarboxylic acid dianhydride having 1 to 3 of aromatic rings or an alicyclic structure is preferable for the present invention.

Further, since an epoxy-modified polyimide of the present invention is often required to have a high solubility in an organic solvent, especially preferable acid dianhydrides are 2,2'-hexafluoropropylidenediphthalic acid dianhydride;

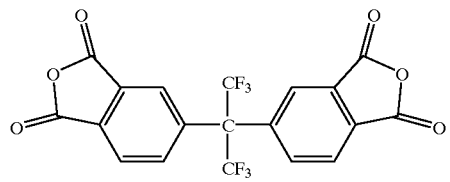

and
2,2-bis(4-hydroxyphenyl)propanedibenzoate-3,3',4,4'-tetracarboxylic acid dianhydride;

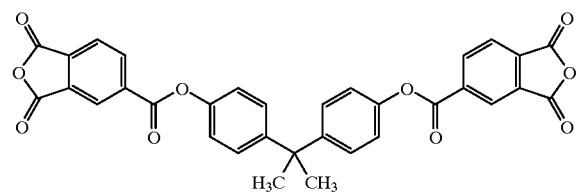

Those tetracarboxylic acid dianhydrides may be used solely or in combination with two or more of them. In the case of combining two or more kinds of acid dianhydrides selected from the foregoing acid dianhydrides and further other acid dianhydride, it is preferable to use 10% by mole of a tetracarboxylic acid dianhydride selected from the following group (I) in the total of acid dianhydride components;

group (I)

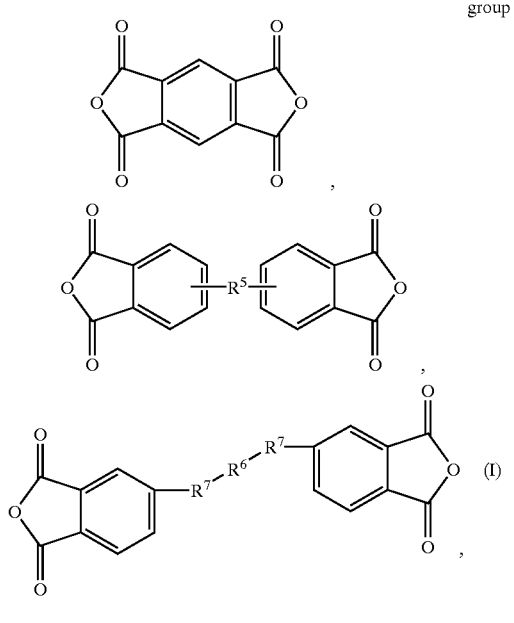

wherein $R^5$ represents $-C_6H_4-$, $-C(CF_3)_2-$, $-CO-$, $-O-$, and a single bond; $R^6$ is a divalent organic group selected from the group (II):

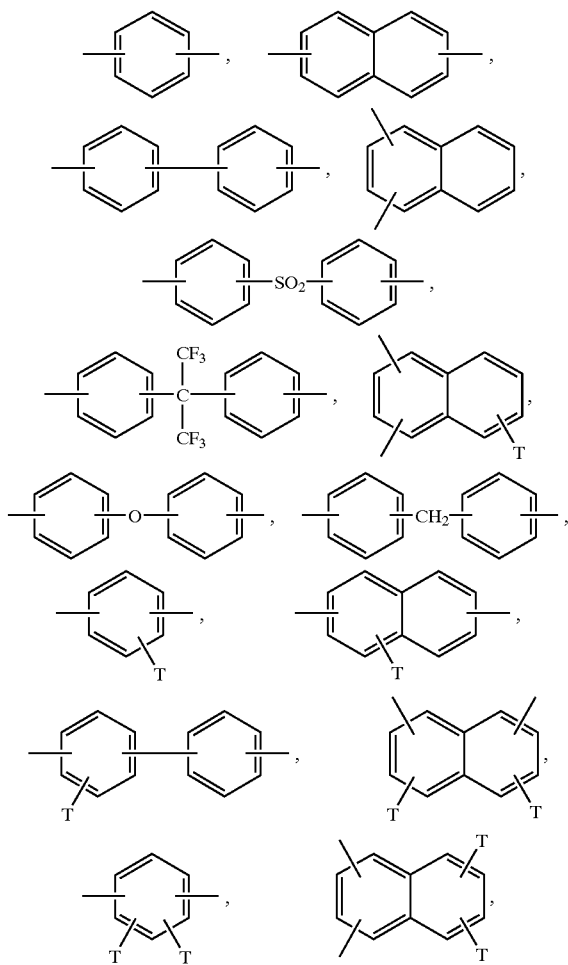

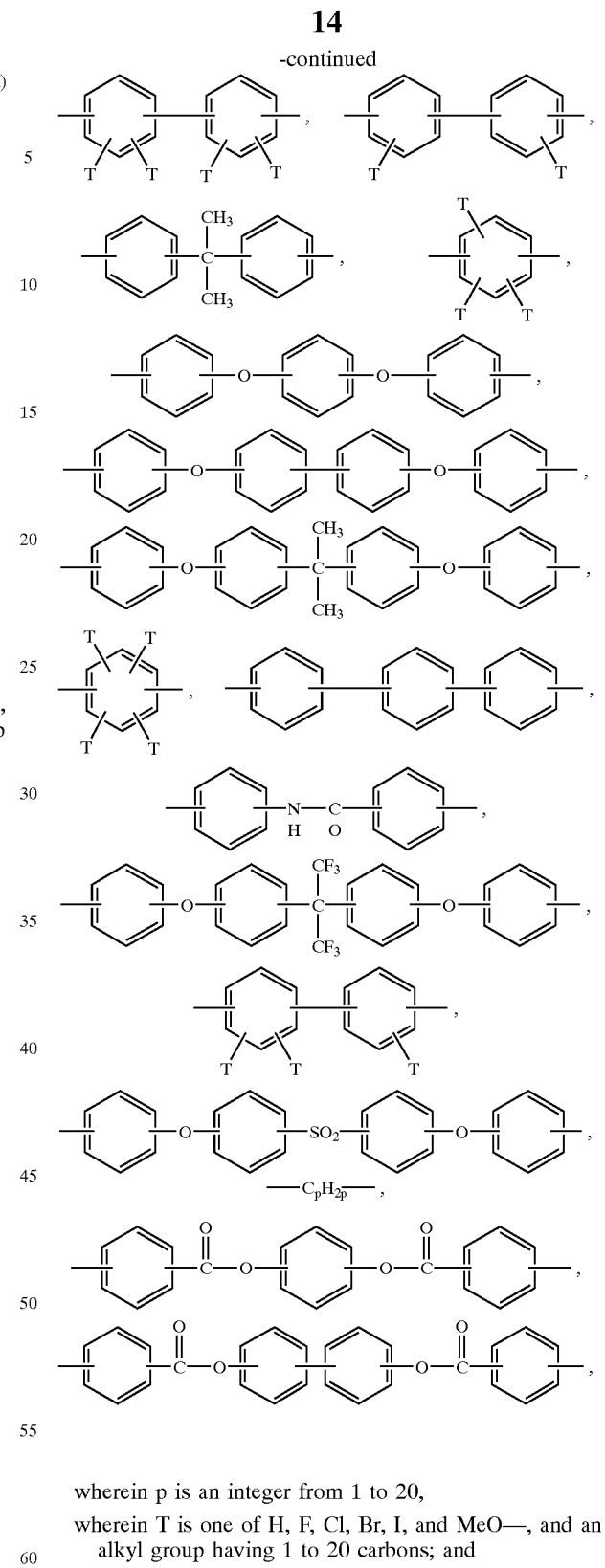

wherein p is an integer from 1 to 20, wherein T is one of H, F, Cl, Br, I, and MeO—, and an alkyl group having 1 to 20 carbons; and $R_7$ is one of —O—, —COO—, or a single bond.

Next, as a diamine having hydroxy groups or carboxy groups, those which have hydroxy groups or carboxy groups may be use without any restriction and the examples are as follows; in terms of example, diaminophenols such as 2,4- diaminophenol; hydroxybiphenyl compounds such as hydroxydiphenylmethane, i.e. such as 3,3'-diamino-4,4'-dihydroxybiphenyl, 4,4'-diamino-3,3'-dihydroxybiphenyl, 4,4'-diamino-2,2'-dihydroxybiphenyl, 4,4'-diamino-2,2',5,5'-tetrahydroxybiphenyl, and the likes; hydroxydiphenylalkanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane, 4,4'-diamino-2,2'5,5'-tetrahydroxydiphenylmethane, and the likes; hydroxydiphenyl ethers such as 3,3'-diamino-4,4'-dihydroxydiphenyl ether, 4,4'-diamino-3,3'-dihydroxydiphenyl ether, 4,4'-diamino-2,2'-dihydroxydiphenyl ether, 4,4'-diamino-2,2',5,5'-tetrahydroxydiphenyl ether, and the likes; diphenylsulfone compounds such as 3,3'-diamino-4,4'-dihydoxydiphenylsulfone, 4,4'-diamino-3,3'-dihydroxydiphenylsulfone, 4,4'-diamino-2,2'-dihydroxydiphenylsulfone, 4,4'-diamino-2,2',5,5'-tetrahydroxydiphenylsulfone, and the likes; bis[(hydroxyphenoxy)phenyl]alkane compounds such as 2,2'-bis[4-(4-amino)-3-hydroxyphenoxy)phenyl]propane and the like; bis(hydroxyphenoxy)biphenyl compounds such as 4,4'-bis(4-amino-3-hydroxyphenoxy)biphenyl and the like; bis[(hydroxyphenoxy)phenyl]sulfone compounds such as 2,2'-bis[(4-(4-amino-3-hydroxyphenoxy)phenyl)sulfone and the like; diaminobenzoic acids such as 3,5-diaminobenzoic acid, and the likes; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl, 4,4'-diamino-2,2',5,5'-tetracarboxybiphenyl, and the likes; carboxydiphenylalkanes such as carboxydiphenylmethane, i.e. 3,3'-diamino-4,4'-dicarboxydiphenylmethane, 4,4'-diamino-3,3'-dicarboxydiphenylmethane, and 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 4,4'-diamino-2,2',5,5'-tetracarboxydiphenylmethane, and the likes; carboxydiphenyl ether compounds such as 3,3'-diamio-4,4'-dicarboxydiphenyl ether, 4,4'-diamino-3,3'-dicarboxydiphenyl ether, 4,4'-diamino-2,2'-dicarboxydiphenyl, 4,4'-diamino-2,2',5,5'- tetracarboxydiphenyl ether, and the likes; diphenylsulfone compounds such as 3,3'-diamino-4,4'-dicarboxydiphenylsulfone, 4,4'-diamino-3,3'-dicarboxydiphenylsulfone, 4,4'-diamino-2,2'-dicarboxydiphenyl, 4,4'-diamino-2,2',5,5'-tetracarboxydiphenylsulfone, and the likes; bis[(carboxyphenoxy)phenyl]alkane compounds such as 2,2'-bis[4-(4-amino-3-carboxyphenoxy)phenyl]propane and the likes; bis[(carboxyphenoxy)biphenyl compounds such as 4,4'-bis(4-amino-3-carboxyphenoxy)biphenyl and the likes; and bis[(carboxyphenoxy)phenyl]sulfone compounds such as 2,2'-bis[4-(4-amino-3-carboxyphenoxy)phenyl]sulfone and the likes and among them, diamine compounds having hydroxy groups or carboxy groups and selected from the following group (III) are easy to get in an industrial sphere and suitable to provide an epoxy-modified polyimide according to the present invention:

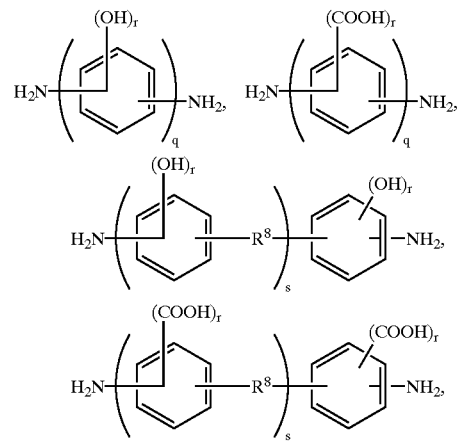

group (III)

wherein q and s are an integer from 1 to 3; r is an integer from 1 to 4; and $R^8$ is a divalent organic group selected from the group consisting of —O—, —S—, —CO—, —$CH_2$—, —$S_2$—, —$C(CH_3)_2$—, —$C(CF_3)_2$—, and —O—$CH_2$—$C(CH_3)_2$—$CH_2$—O—.

A diamine compound referred to as $R^3$ in the general formula (1) defining a polyimide of the present invention, that is, a diamine compound having no hydroxy group and carboxy group is not particularly limited and its examples are as follows; aromatic diamines such as p-phenylenediamine, m-phenylenediamine, 4,4'-diaminodiphenylmethane, 4,4'-diaminodiphenylethane, 4,4'-diaminodiphenyl ether, 4,4'-diaminodiphenylsulfide, 4,4'-diaminodiphenylsulfone, bis[4-(3-aminophenoxy)phenyl]sulfone, 1,5-diaminonaphthalene, 3,3'-dimethyl-4,4'-diaminobiphenyl, 5-amino-1-(4'-aminophenyl-1,3,3-trimethylindane, 6-amino-1-(4'-aminophenyl)-1,3,3-trimethylindane, 4,4'-diaminobenzanilide, 3,5-diamino-3'-trifluoromethylbenzanilide, 3,5-diamino-4'-trifluoromethylbenzanilide, 3,4'-diaminodiphenyl ether, 2,7-diaminofluorene, 2,2-bis(4-aminophenyl)hexafluoropropane, 4,4'-methylene-bis(2-chloroaniline), 2,2',5,5'-tetrachloro-4,4'-diaminobiphenyl, 2,2'-dichloro-4, 4'-diamino-5,5'-dimethoxybiphenyl, 3,3'-dimethoxy-4,4'-diaminobiphenyl, 4,41-diamino-2,2'-bis(trifluoromethyl) biphenyl, 2,2'-bis[4-(4-aminophenoxy)phenyl]propane, 2,2'-bis[4-(4-aminophenoxy)phenyl]hexafluoropropane, 1,4-bis (4-aminophenoxy)benzene, 4,4'-bis(4-aminophenoxy) biphenyl, 1,3'-bis(4-aminophenoxy)benzene, 9,9-bis(4-aminophenyl)fluorene, 4,4'-(p-phenyleneisopropylidene) bisaniline, 4,4'-(m-phenyleneisopropylidene)bisaniline, 2,2'-bis[4-(4-amino-2-trifluoromethylphenoxy)phenyl] hexafluoropropane, 4,4'-bis[4-(4-amino-2-trifluoromethyl) phenoxy]octafluorobiphenyl, and the likes; aromatic diamines containing two amino groups bonded to an aromatic ring and a hetero atom besides the nitrogen atom of the amino groups such as diaminotetraphenylthiophene; aliphatic diamines and alicyclic diamines such as 1,1-metaxylylenediamine, 1,3-propanediamine, tetramethylenediamine, pentamethylenediamine, octamethylenediamine, nonamethylenediamine, 4,4-diaminoheptamethylenediamine, 1,4-diaminocyclohexane, isophoronediamine, tetrahydrodicyclepentadienylenediamine, hexahydro-4,7-methanoindanylene-dimethylenediamine, tricyclo[6,2,1,0$^{2.7}$]-undecylenedimethyldiamine, 4,4'-methylenebis (cyclohexylamine), and the likes; mono-substituted phenylenediamines having a defined formula

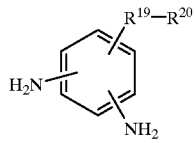

(wherein $R^{19}$ denotes a bivalent organic group selected from —O—, —COO—, —OCO—, —CONH—, and —CO—; and $R^{20}$ denotes a monovalent organic group having a steroid skeletal structure); and compounds having a define formula

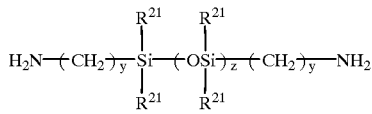

(wherein $R^{21}$ denotes a hydrocarbon group of 1–12 carbons; the reference character y denotes an integer from 1 to 3; and the reference character z denotes an integer from 1 to 20.). Diamine compounds as those having no hydroxy group and carboxy group of the present invention are preferably selected from the group (IV)

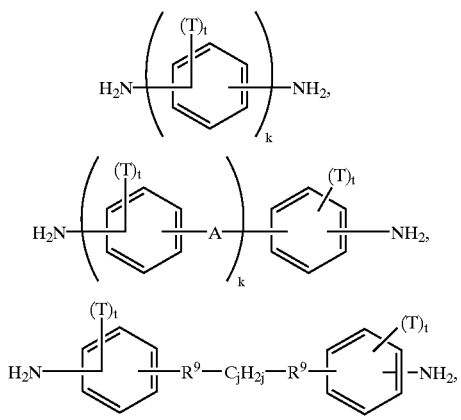

wherein T is one of H, F, Cl, Br, I, $CH_3O$—, and an alkyl group having 1 to 20 carbons;
A is one of —C(=O)—, —$SO_2$—, —O—, —S—, $(CH_2)_m$—, —NHCO—, —C($CH_3$)$_2$—, —C($CF_3$)$_2$—, —C(=O)O—, —O—$CH_2$—C($CH_3$)$_2$—$CH_2$—O—, and a bond;
$R^9$ is one of —O—, —C(=O)O—, —O(O=)C—, —$SO_2$—, —C(=O)—, —S—, —C($CH_3$)$_2$—, and a bond;
k is an integer from 0 to 4;
t is an integer from 1 to 4; and
j is an integer from 1 to 20.

Further, to use bis[4-(3-aminophenoxy)phenyl]sulfone is especially preferable to heighten the solubility of the polyimide. The foregoing diamine compounds may be used solely or in combination with two or more of them.

A method for producing a polyamide acid is not specifically restricted and any general polymerization method may be employed. Hereafter a polymerization method to be especially preferably employed will be described. That is, a polyamide acid is produced by dissolving a diamine compound in an organic solvent or dispersing in a slurry state, adding an acid dianhydride dissolved in an organic solvent or dispersed in an organic solvent in a slurry state or in a solid state, and carrying out reaction of them.

In the present invention, as the diamine component, a diamine compound having hydroxy groups or carboxy groups is used, however other diamine compound which does not contain these functional groups may be employed and copolymerized with an acid dianhydride component. For example, it is also allowable that two types of diamine compounds (a diamine compound-1 and a diamine compound-2) are added to an organic polar solvent and then an acid dianhydride is added to give an amide acid polymer solution.

Further, two types of acid dianhydrides (an acid dianhydride-1 and an acid dianhydride-2) and a diamine compound may be copolymerized. In this case, a diamine compound is added prior in an organic polar solvent and then the acid dianhydride-1 and the acid dianhydride-2 are added successively to obtain a polyamide acid polymerization solution. Furthermore, in the case where respectively two types of diamine compounds and acid dianhydrides are used, the diamine compound-1 and the diamine compound-2 are added prior in an organic polar solvent and the acid dianhydride-1 and then the acid dianhydride-2 are added to obtain a poly(amide acid) polymerization solution.

In the present invention, the polymerization procedure of a polyamide acid is not specifically restricted and the foregoing addition order may be reversed as to add acid dianhydrides prior and then add diamine compounds to obtain a polyimide of the present invention.

Regardless of the combinations of those reaction components, the ratio of the total mole number of diamine compounds and the total mole number of acid dianhydrides is preferably (100:90) to (90:100) and, in general, the ratio is approximately as equivalent mole ratio as (100:99) to (99:100). The reaction temperature in the case of the polyamide acid polymerization is desirably at −20° C. to 90° C. The reaction duration is from 30 minutes to 24 hours.

The weight average molecular weight of a polyamide acid is preferably 5,000 to 1,000,000. If the weight average molecular weight is less than 5,000, the molecular weight of the obtained polyimide also becomes low and it is undesirable to use the polyimide as it is for the polyimide becomes brittle. On the other hand, if the weight average molecular weight exceeds 1,000,000, the viscosity of the polyamide acid varnish becomes too high and makes the polyimide difficult to handle and thus it is undesirable. Their molecular weights can be adjusted by adjusting the mole ratio of diamine compounds and acid dianhydrides to be added, the reaction temperature, the reaction duration, the pressure, and so forth. Additionally, various types of organic additives, inorganic fillers, and various types of reinforcing materials may be mixed with a polyamide acid to obtain a polyimide composit.

As an organic polar solvent to be used for production reaction of a poly(amide acid), for example, the following are available: sulfoxide type solvents such as dimethyl sulfoxide and diethyl sulfoxide; formamide type solvents such as N,N-dimethylformamide and N,N-diethylformamide; acetamide type solvents such as N,N-dimethylacetamide and N,N-diethylacetamide; pyrrolidone type solvents such as N-methyl-2-pyrrolidone and N-vinyl-2-pyrrolidone; phenol type solvents such as phenol, o-, m-, or p-cresol, xylenol, halophenol, and catechol; ether type solvents such as tetrahydrofuran and dioxane; alcohol type solvents such as methanol, ethanol, and butanol; cellosolve type solvents such as butyl cellosolve; and hexamethylphosphoryl amide and γ-butyrolactone and these solvents are preferably used solely or as a mixture and additionally aromatic hydrocarbons such as xylene and toluene are also usable. The solvents are not specifically limited as long as they can dissolve a polyamide acid therein. The preferable method of converting into polyimide of the present invention will be described later and by the conversion, solvent removal and the imidation are simultaneously to be carried out by decreased pressure heating of a polyamide acid, so that it is advantageous in a viewpoint of the process to select an organic solvent which can dissolve the polyamide acid therein and has a rather low boiling point.

Next, the process of imidation of a polyamide acid will be described below. A thermal method and a chemical method are employed as the method for converting into polyimide of a polyamide acid. In the imidation reaction, reaction water is produced. The produced water causes hydrolysis of the polyamide acid and results in the decrease of the molecular weight. In order to obtain a polyimide with a high molecular weight, it is therefore required to carry out imidation while removing water. As a method for removing water, the following are known available:

1) a method for removing water based on azeotropy by adding an solvent such as toluene and xylene which can form a azeotropic mixture with water; and
2) a chemical imidation method by adding an aliphatic acid dianhydride such as acetic anhydride and a tertiary amine such as triethylamine, pyridine, picoline, and isoquinoline.

Those methods are applicable for imidation to obtain polyimide having hydroxy groups and carboxy groups relevant to the present invention.

However, in the method 1) for removing water based on azeotropy, water exists in the solution system and hydrolysis by the water is easy to be caused. On the other than, in the chemical imidation method 2), though it is advantageous as compared with the method 1) in the terms of hydrolysis-less since the produced water is chemically removed by an aliphatic acid dianhydride, the aliphatic acid dianhydride and the tertiary amine remain in the reaction system and therefore a process for removing these remaining compounds is required to be carried out.

Hence, a method particularly preferable to be employed for the present invention is a method in which water produced during the imidation is heated in decreased pressure to actively remove the water out of the system, to suppress hydrolysis, and to avoid the decrease of the molecular weight. By the method, even if the polymerization reaction of a polyamide acid is stopped attributed to that used acid dianhydride raw materials are contaminated with the resultant compound of ring-opening of a tetracarboxylic acid by hydrolysis or the resultant compound of ring-opening of one of acid dianhydrides, the ring-opened acid dianhydrides are again ring-closed and turned back to the acid dianhydrides by decreased pressure heating during the imidation and reacted with the amine remaining in the system to result in increase of the molecular weight.

The heating condition of the imidation is preferably 80 to 400° C. and it is further preferably at 100° C. or higher, at which imidation can efficiently be carried out and water can efficiently be removed, and furthermore preferably at 120° C. or higher. The highest temperature is preferable to be set at thermal decomposition temperature of the polyimide or lower and in general, since the imidation can almost be completed at 250 to 350° C., the highest temperature may be set around the range.

Regarding the pressure condition for decreased pressure heating, the pressure is preferably low and as long as water produced during the imidation can efficiently be removed in the foregoing heating condition, the pressure at any level is allowable. More practically, the pressure for the decreased-pressure heating is 0.09 to 0.0001 MPa, preferably 0.08 to 0.0001 MPa, and further preferably 0.07 to 0.001 MPa.

Regarding a decreased-pressure heating preferable to be employed for the present invention for direct imidation by heating and drying a polyamide acid solution in a decreased pressure, any apparatus can be employed as long as it can carry out heating and drying in a decreased pressure. As a batch type decreased-pressure heating apparatus, a vacuum oven is an example. Further, as a continuous apparatus, an extruder equipped with a pressure-decreasing apparatus is an example. The extruder is preferably a biaxial or tri-axial extruder. Those apparatuses may properly be selected depending on the productivity. In this case, the extruder equipped with the pressure-decreasing apparatus is a common melt extruder to heat and melt a thermoplastic resin and to which a pressure-decreasing mechanism and a mechanism for removing a solvent are attached. By using the extruder equipped with a pressure-decreasing apparatus, while a polyamide solution being mixed, imidation is carried out and at the same time while the solvent and water produced in the imidation reaction being removed, a polyimide having hydroxy groups or carboxy groups is produced.

Next, a method for producing an epoxy-modified polyimide will be described. The above described polyimide having hydroxy groups or carboxy groups is dissolved in an organic solvent and reacted with an epoxy compound to obtain an epoxy-modified polyimide of the present invention. The epoxy-modified polyimide is desirable to have thermoplasticity and a glass transition temperature at 350° C. or lower.

A solvent to be employed for an epoxy compound and a polyimide having hydroxy groups or carboxy groups is not specifically limited as long as it does not react on epoxy group and is capable of dissolving a polyimide having hydroxy groups or carboxy groups. For example, the solvents usable are sulfoxide type solvents such as dimethyl sulfoxide and diethyl sulfoxide; formamide type solvents such as N,N-dimethylformamide and N,N-diethylformamide; acetamide type solvents such as N,N-dimethylacetamide and N,N-diethylacetamide; pyrrolidone type solvents such as N-methyl-2-pyrrolidone and N-vinyl-2-pyrrolidone; ether type solvents such as tetrahydrofuran and dioxane; alcohol type solvents such as methanol, ethanol, and butanol; cellosolve type solvents such as butyl cellosolve; and hexamethylphosphoryl amide and γ-butyrolactone, and additionally aromatic hydrocarbons such as xylene and toluene are also usable. These solvents are preferably used solely or as a mixture. Since almost all of epoxy-modified polyimides of the present invention are used finally after removal of the solvents, it is important to select solvents having a boiling point as low as possible.

An epoxy compound to be use for reaction with a polyimide having hydroxy groups and carboxy groups will be described hereafter. An epoxy compound to be used preferably is an epoxy compound having two or more epoxy groups and a compound having an epoxy group and a carbon—carbon double or carbon—carbon triple bond.

The epoxy compound having two or more epoxy groups means a compound having two or more epoxy groups in the molecule and examples are the following. In terms of example, a bisphenol resin such as Epikote 828 (made by Yuka Shell Epoxy K.K), an o-cresol novolac resin such as 180 S 65 (made by Yuka Shell Epoxy K.K), a bisphenol A novolac resin such as 157 S70 (made by Yuka Shell Epoxy K.K), a tris(hydroxyphenyl)methane novolac resin such as 1032 H60 (made by Yuka Shell Epoxy K.K), and naphthalenearalkyl novolac resin such as ESN 375 and glycidylamine type resin such as tetraphenylolethane 1031S (made by Yuka Shell Epoxy K.K), YGD 414S (made by Tohto Kasei Co., Ltd.), tris(hydroxyphenyl)methane EPPN 502H (made by Nippon Kayaku Co., Ltd.), specific bisphenol VG 3101L (Mitsui Chemicals, Inc.), specific naphthol NC 7000 (made by Nippon Kayaku Co., Ltd.), TETRAD-X, TETRAD-D (made by Mitsubishi Gas Chemicals Co., Inc.), and alicyclic epoxy resin such as Adekaoptomer KRM-2110 (made by ASAHI DENKAKOGYO K.K.), Adekaoptomer SP-170(made by ASAHI DENKAKOGYO K.K.), and the likes.

The compound having an epoxy group and a carbon—carbon double bond is not specifically limited as long as it has an epoxy group and a carbon—carbon double bond in the molecule and the examples are following. That is, allyl glycidyl ether, glycidyl acrylate, glycidyl methacrylate, glycidyl vinyl ether, and the likes.

The compound having an epoxy group and a carbon—carbon triple bond is not specifically limited as long as it has an epoxy group and a carbon—carbon triple bond in the molecule and the examples are following. That is, propargyl glycidyl ether, glycidyl propionate, ethynyl glycidyl ether, and the likes.

In order to cause reaction of those epoxy compounds and a polyimide having hydroxy groups or carboxy groups, they are dissolved in an organic solvent and heated to carry out the reaction. On one hand, any dissolution method can be employed and the other hand the reaction temperature is preferably 40° C. or higher and 130° C. or lower. Especially for an epoxy compound having a carbon—carbon double bond or carbon—carbon triple bond, it is preferable to carry out the reaction around a temperature at which the carbon—carbon double bond or carbon—carbon triple bond is not decomposed or cross-linked, and more practically, the temperature preferably ranges 40° C. or higher to 100° C. or lower and the more preferably ranges 50° C. or higher and 90° C. or lower. The reaction duration is around several minutes to around 8 hours. In such a manner, an epoxy-modified polyimide solution can be obtained.

A thermoplastic resin such as polyesters, polyamides, polyurethanes, polycarbonates, and the likes may be mixed with the epoxy-modified polyimide solution and a thermosetting resin such as epoxy resins, acrylic resins, bismaleimide, bisallyldimide, phenol resins, cyanate resins, and the likes may also be mixed with the solution. In addition to that, various coupling agents may be mixed.

In the case a hardening agent commonly used for an epoxy resin is added to an epoxy-modified polyimide of the present invention, a hardened material with excellent physical properties can sometimes be obtained. Such tendency is especially noticeable in the case of an epoxy-modified polyimide obtained by reaction of a polyimide having hydroxy groups or a carboxy groups and an epoxy compound having two or more epoxy groups. As the hardening agent for an epoxy resin in this case, representative examples are amine type, imidazole type, acid anhydride type, and acid type ones.

Next, a photosensitive composition of the present invention contains at least (A) an epoxy-modified polyimide having a structural unit defined as a general formula (1);

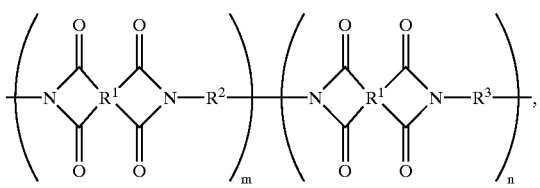

General formula (1)

wherein $R^1$ is a tetravalent organic group; $R^3$ is a divalent organic group; and $R^2$ is a divalent organic group containing 1 to 4 organic groups selected from the group consisting of:

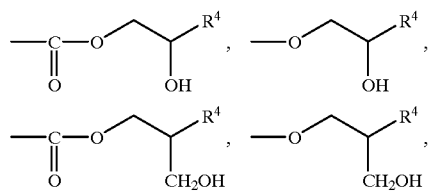

wherein $R^4$ is a monovalent organic group containing at least one selected from the group consisting of an epoxy group, a carbon—carbon double bond, and a carbon—carbon triple bond;
m is an integer of 1 or more; and
n is an integer of 0 or more, and (B) a photoreaction initiator and/or a sensitizer.

A photosensitive composition of another embodiment of the present invention contains at least (A) an epoxy-modified polyimide having a structural unit defined as a general formula (1);

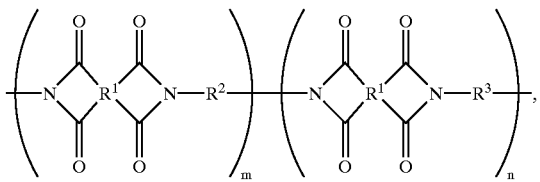

General formula (1)

wherein $R^1$ is a tetravalent organic group; $R^3$ is a divalent organic group; and $R^2$ is a divalent organic group containing 1 to 4 organic groups selected from the group consisting of:

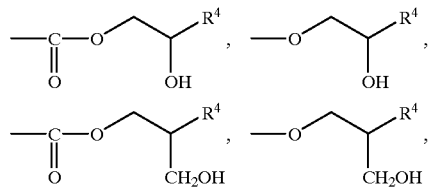

wherein $R^4$ is a monovalent organic group containing at least one selected from the group consisting of an epoxy group, a carbon—carbon double bond, and a carbon—carbon triple bond;
m is an integer of 1 or more; and
n is an integer of 0 or more,
(B) a photoreaction initiator and/or a sensitizer, and (C) a reactive monomer or oligomer having a reactive carbon—carbon unsaturated bond.

Such a photosensitive composition relevant to the present invention can be produced by dissolving at least (A) the forgoing epoxy-modified polyimide of the present invention and (B) a photoreaction initiator in a proper organic solvent. In the state where the epoxy-modified polyimide is dissolved in a proper organic solvent, the epoxy-modified polyimide can be used in a solution (varnish) state, making it convenient to form a film.

As the organic solvent to be employed in this case, a non-proton type polar solvent is preferable from a viewpoint of solubility and practically, preferable examples are N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphoryl triamide, N-acetyl-ε-caprolactam, dimethylimidazolidinone, diethylene glycol dimethyl ether, triethylene glycol dimethyl ether, γ-butyrolactone, dioxane, dioxolan, tetrahydrofuran, and the likes. These solvents can be used solely or as a mixture. The organic solvent may be an organic solvent used for modification with an epoxy compound and left as it is or may be added newly to the epoxy-modified polyimide after isolation. Further, in order to improve the property for coating, a solvent such as toluene, xylene, diethyl ketone, methoxybenzene, cyclopentanone, and the like can be added to the extent to which the solvent does not cause a bad effect on the solubility of a polymer.

Below, description will be given regarding a photoreaction initiator as the (B) component preferably added in the case of providing an epoxy-modified polyimide composition of the present invention with photosensitivity. As one example of compounds which generate radicals by light rays with a long wavelength of about that of g-rays, the acylphosphine oxide compounds having following general formula (5) and general formula (6)

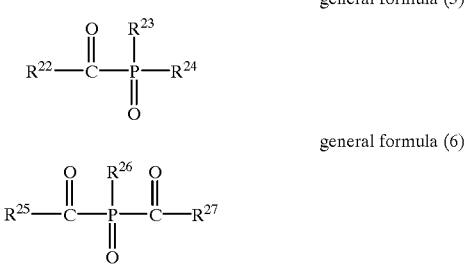

general formula (5)

general formula (6)

(wherein $R^{22}$, $R^{25}$, and $R^{27}$ separately denotes —$C_6H_5$, —$C_6H_4(CH_3)$, —$C_6H_2(CH_3)_3$, —$C(CH_3)_3$, or —$C_6H_3Cl_2$; and $R^{23}$, $R^{24}$, and $R^{26}$ separately denotes —$C_6H_5$, methoxy, ethoxy, —$C_6H_4(CH_3)$, or —$C_6H_2(CH_3)_3$).

The radical generated from the compounds reacts on reactive groups (vinyl, acryloyl, methacryloyl, allyl, and the likes) having a carbon—carbon double bond and promotes cross-linking. Especially, an acylphosphine oxide defined as the general formula (6) is preferable since it generates four radical groups by α ring-opening as compared with a compound having the general formula (5) generates 2 radical groups.

Further, a photolytic cation generating agent using as a photoreaction initiator can be a hardening agent of an epoxy-modified polyimide obtained by reaction with an epoxy compound having two or more epoxy groups, because it promotes the hardening reaction of the epoxy group. In terms of examples, the following can be employed as such an initiator: diphenyl iodonium salts such as dimethoxyanthraquinonesulfonic acid diphenyl iodonium salt; triphenylsulfonium salts, pyrylium salts, triphenylonium salts, and diazonium salts. In this case, it is preferable to add an alicyclic epoxy or vinyl ether compound with high cationic hardenability.

Further, in the same manner, a photolytic basic group generating agent as a photoreaction initiator can thus be a hardening agent of an epoxy-modified polyimide obtained by reaction with an epoxy compound having two or more epoxy groups, because it promotes the hardening reaction of the epoxy group. In terms of examples, the following can be employed as such an initiator: urethane compounds obtained by reaction of nitrobenzyl alcohol or dinitrobenzyl alcohol with an isocyanate; urethane compounds obtained by reaction of nitro-1-phenylethyl alcohol or dinitro-1-phenylethyl alcohol with an isocyanate; urethane compounds obtained by reaction of dimethoxy-2-phenyl-2-propanol with an isocyanate; and the likes.

Additionally, the photoreaction initiators exemplified above are preferably mixed with an epoxy-modified polyimide of the present invention at a ratio of 0.1 to 50 parts by weight, more desirably 0.3 to 20 parts by weight, to 100 parts by weight of the epoxy-modified polyimide. If the ratio is out of the range of 0.1 to 50 parts by weight, undesirable effects are possibly caused on physical properties and the developing properties. The photoreaction initiators may be used solely or as a mixture of several types of them.

Next, description will be given regarding a sensitizer. A variety of peroxides may be added to a photosensitive composition of the present invention as a radical polymerization initiator of an epoxy-modified polyimide having a carbon—carbon double bond or a carbon—carbon triple bond in the structure. Among peroxides, 3,3',4,4'-tetra(t-butylperoxycarbonyl)benzophenone is preferable one to be employed. The radical polymerization initiators are especially preferable to be employed in combination with a sensitizer exemplified below. The following are the example of the sensitizer: Micheler's ketone, bis-4,4'-diethylaminobenzophenone, benzophenone, camphorquinone, benzyl, 4,4'-dimethylaminobenzyl, 3,5-bis(diethylaminobenzylidene)-N-methyl-4-piperidone, 3,5-bis(dimethylaminobenzylidene)-N-methyl-4-piperidone, 3,5-bis(diethylaminobenzylidene)-N-ethyl-4-piperidone, 3,3'-carbonyl-bis(7-diethylamino)cumarin, 3,3'-carbonyl-bis(7-dimethylamino)cumarin, riboflavin tetrabutyrate, 2-methyl-1-[4-(methylthio)phenyl]-2-morpholinopropan-1-one, 2,4-dimethylthioxanthone, 2,4-diethylthioxanthone, 2,4-diisopropylthioxanthone, 3,5-dimethylthioxanthone, 3,5-diisopropylthioxanthone, 1-phenyl-2-(ethoxycarbonyl) oxyiminopropan-1-one, benzoin ether, bezoin isopropyl ether, benzanthrone, 5-nitroacenaphthene, 2-nitrofluorene, anthrone, 1,2-benzanthraquinone, 1-phenyl-5-mercapto-1H-tetrazole, thioxanthen-9-one, 10-thioxanthenone, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxcyclohexanone, 2,6-di(p-diethylaminobenzal))-4-hydroxycyclohexanone, 4,6-dimethyl-7-ethylaminocumarin, 7-diethylamino-4-methylcumarin, 7-diethylamino-3-(1-methylbenzoimidazolyl)cumarin, 3-(2-benzoimidazolyl)-7-diethylaminocumarin, 3-(2-benzothiazolyl)-7-diethylaminocumarin, 2-(p-dimethylaminostyryl)benzooxazole, 2-(p-dimethylaminostyryl)quinoline, 4-(p-dimethylaminostyryl) quinoline, 2-(p-dimethylaminostyryl)benzothiazole, and 2-(p-dimethylaminostyryl)-3,3-dimethyl-3H-indole, and the likes.

The sensitizers are preferably mixed with an epoxy-modified polyimide of the present invention at a ratio of 0.1 to 50 parts by weight, more desirably 0.3 to 20 parts by weight, to 100 parts by weight of the epoxy-modified polyimide. If the ratio is out of the range of 0.1 to 50 parts by weight, no sensitizing effect can be obtained and sometimes, undesirable effects are possibly caused on the developing properties. The sensitizers may be used solely or as a mixture of several types of them.

In addition to that, in the case of providing an epoxy-modified polyimide composition of the present invention with photosensitivity, it is desirable to add a photopolymerization assisting agent in order to obtain practically usable photosensitivity.

The following can be employed as the photopolymerization assisting agent: for example, 4-diethylaminoethylbenzoate, 4-dimethylaminoethylbenzoate, 4-diethylaminopropylbenzoate, 4-dimethylaminopropylbenzoate, 4-dimethylaminoisoamylbenzoate, N-phenylglycine, N-methyl-N-phenylglycine, N-(4-cyanophenyl)glycine, 4-dimethylaminobenzonitrile, ethylene glycol thioglycolate, ethylene glycol di(3-mercaptopropionate), trimethylolpropane thioglycol, trimethylolpropane tri(3-mercaptopropionate), pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), dipentaerythritol hexa(3-mercaptopropionate), thioglycollic acid, α-mercaptopropionic acid, t-butylperoxybenzoate, t-butylperoxymethoxybenzoate, t-butylperoxynitrobenzoate, t-butylperoxyethylbenzoate, phenylisopropylperoxybenzoate, di-t-butylperoxyisophthalate, tri-t-butyltriperoxytrimellitate, tri-t-butyltriperoxytrimesitate, tetra-t-butyltetraperoxypyromellitate, 2,5-dimethyl-2,5-di(benzoylperoxy)hexane, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 2,6-di(p-azidobenzal)-4-hydroxycyclohexanone, 2,6-di(p-azidobenzal)-4-carboxycyclohexanone, 2,6-di(p-azidobenzal)-4-methoxycyclohexanone, 2,6-di(p-azidobenzal)-4-hydroxymethylcyclohexanone, 3,5-di(p-azidobenzal)-1-methyl-4-piperidone, 3,5-di(p-azidobenzal)-4-piperidone, 3,5-di(p-azidobenzal)-N-acetyl-4-piperidone, 3,5-di(p-azidobenzal)-N-methoxycarbonyl-4-piperidone, 2,6-di(p-azidobenzal)-4-hydroxycyclohexanone, 2,6-di(m-azidobenzal)-4-carboxycyclohexanone, 2,6-di(m-azidobenzal)-4-methoxycyclohexanone, 2,6-di(m-azidobenzal)-4-hydroxymethylcyclohexanone, 3,5-di(m-azidobenzal)-N-methyl-4-piperidone, 3,5-di(m-azidobenzal)-4-piperidone, 3,5-di(m-azidobenzal)-N-acetyl-4-piperidone, 3,5-di(m-azidobenzal)-N-methoxycarbonyl-4-piperidone, 2,6-di(p-azidocinnamylidene)-4-hydroxycyclohexanone, 2,6-di(p-azidocinnamylidene)-4-carboxycyclohexanone, 2,6-di(p-azidocinnamylidene)-4-cyclohexanone, 3,5-di(p-azidocinnamylidene)-N-methyl-4-piperidone, 4,4'-diazidochalcone, 3,3'-diazidochalcone, 3,4'-diazidochalcone, 4,3'-diazidochalcone, 1,3-diphenyl-1,2,3-propanetrione-2-(o-acetyl)oxime, 1,3-diphenyl-1,2,3-propanetrione-2-(o-n-propylcarbonyl)oxime, 1,3-diphenyl-1,2,3-propanetrione-2-(o-n-methoxycarbonyl)oxime, 1,3-diphenyl-1,2,3-propanetrione-2-(o-ethoxycarbonyl)oxime, 1,3-diphenyl-1,2,3-propanetrione-2-(o-benzoyl)oxime, 1,3-diphenyl-1,2,3-propanetrione-2-(o-phenyloxycarbonyl)oxime, 1,3-bis(p-methylphenyl)-1,2,3-propanetrione-2-(o-benzoyl)oxime, 1,3-bis(p-methoxyphenyl)-1,2,3-propanetrione-2-(o-n-ethoxycarbonyl)oxime, 1-(p-methoxyphenyl)-3-(p-nitrophenyl)-1,2,3-propanetrione-2-(o-phenyloxycarbonyl)oxime, and the likes. Nevertheless, the agent is not restricted to those compounds. Additionally, trialkylamines such as triethylamine, tributylamine, triethanolamine, and the likes can be added as another assisting agent.

The photopolymerization assisting agent are preferably mixed with an epoxy-modified polyimide at a ratio of 0.1 to 50 parts by weight, more desirably 0.3 to 20 parts by weight, to 100 parts by weight of the epoxy-modified polyimide. If the ratio is out of the range of 0.1 to 50 parts by weight, the aimed sensitivity improving effect cannot be obtained and undesirable effects are possibly caused on the developing properties. The photopolymerization assisting agents may be used solely or as a mixture of several types of them.

In addition to a photoreaction initiator or a sensitivity improving agent, which is the foregoing component (B), (C) a monomer or oligomer having a reactive carbon—carbon unsaturated bond may be added to a photosensitive composition of the present invention in order to further improve the photosensitivity.

The monomer or oligomer (C) having a reactive carbon—carbon unsaturated bond is a compound having a reactive carbon—carbon unsaturated bond and is preferably capable of making the photopolymerization easy. The examples of the monomer or oligomer are as follows: 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxypolyethylene glycol methacrylate, β-methacryloyloxyethylhydrodiene phthalate, β-methacryloyloxyethylhydrodiene succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethylhydrodiene succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxydiethoxy)phenyl]propane, 2,2-bis[4-(methacryloxypolyethoxy)phenyl]propane, polyethylene glycol diacrylate, tripropylene glycol diacrylate, polypropylene glycol diacrylate, 2,2-bis[4-(acryloxydiethoxy)phenyl]propane, 2,2-bis[4-(acryloxypolyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-hexanediol methacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecanedimethanol diacrylate, 2,2-hydrogenated bis[4-acryloxypolyethoxy)phenyl]propane, 2,2-bis[4-acryloxypolypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethaneacrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxyate, triallylamine, triallyl citrate, triallyl phosphate, allobarbital, diallylamine, diallyldimethylsilane, diallyl disulfide, diallyl ether, diallyl cyanurate, diallyl isophthalate, diallyl terephthalate, 1,3-diallyloxy-2-propanol, diallyl sulfide, diallyl maleate, 4,4'-isoprpylidenediphenol dimethacrylate, 4,4'-isopropylidenediphenol diacrylate, and the likes. The monomer or oligomer is not necessarily restricted to those compounds.

In order to improve the cross-linking density, a photosensitive composition of the present invention is preferable to further contain a monomer with two functional groups. The monomers or oligomers having a reactive carbon—carbon unsaturated bond are preferably mixed with an epoxy-modified polyimide of the present invention at a ratio of 1 to 200 parts by weight, more desirably 3 to 150 parts by weight, to 100 parts by weight of the epoxy-modified polyimide. If the ratio is out of the range of 1 to 200 parts by weight, the aiming effect cannot sometimes be obtained and undesirable effects are possibly caused on the developing properties. The monomers or oligomers having a reactive carbon—carbon unsaturated bond may be used solely or as a mixture of several types of them.

A photosensitive composition of the present invention may further contain a proper organic solvent. If the composition is dissolved in a proper organic solvent, the composition can be used in the solution state and is excellent in film formability. As the solvent to be employed in this case, a non-proton type polar solvent is preferable from a viewpoint of solubility and practically, preferable examples are N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphoryl triamide, N-acetyl-ε-caprolactam, dimethylimidazolidinone, diethylene glycol dimethyl ether, triethylene glycol dimethyl ether, γ-butyrolactone, dioxane, dioxolan, tetrahydrofuran, and the likes. These solvents can be used solely or as a mixture. The organic solvent may be an organic solvent used for polyimide synthetic reaction and left as it is or may be added newly to the polyimide precursors after isolation. Further, in order to improve the film formability, a solvent such as toluene, xylene, diethyl ketone, methoxybenzene, cyclopentanone, and the like can be added to the extent to which the solvent does not cause a bad effect on the solubility. Especially in the case where cyclopentanone is used as a solvent, a photosensitive composition excellent in the film formability can be obtained.

Next, a coverlay film having photosensitivity of the present invention can be obtained by pouring or applying a photosensitive composition produced from the foregoing epoxy-modified polyimides to be film-shape and drying the resultant composition. In this case, after being applied to a supporting body of such as a metal or PET film and dried, the composition may be handled in a single film state by separating the resultant coverlay film from the supporting body. On the other hand, as shown in FIG. 1, the coverlay film may be handled while being laminated on the film 16 of such as PET or the like. Also, the coverlay film may be an embodiment of a laminated state in which a protection film 12 is laminated on the surface of a photosensitive polyimide 14. Drying of the photosensitive composition is preferably carried out at a temperature at which the epoxy group or the double and triple bonds are prevented from deactivated by heat. Practically, the temperature is 180° C. or lower and preferably 150° C. or lower. The drying temperature may be increased from a low temperature step by step. The duration for drying is sufficiently long to evaporate almost all of the contained solvent and to form film from the applied varnish. Practically, the duration is several minutes to 30 minutes, preferably several minutes to 15 minutes.

Figure 2:
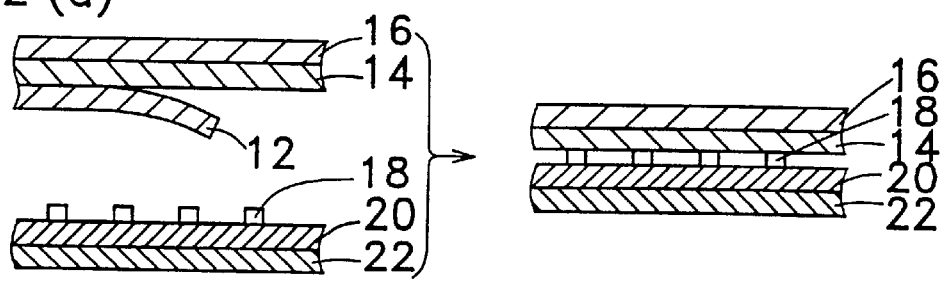
FIGS. 2(a) to 2(d) show a process of producing a flexible printed wiring board by using a coverlay film of the present invention.
Figure 2:
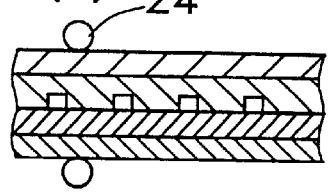
Figure 2:
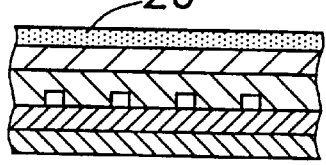
Figure 2:
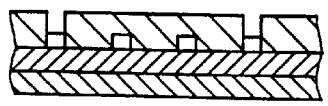

The photosensitive coverlay film obtained in such a manner can be used as a part of a printed wiring board. FIG. 2 illustrates a process of laminating an electric wiring board. This process is a process for protecting the conductor surface of a FPC, in which a circuit is previously formed using a conductor such as a copper foil, with a photosensitive coverlay film. The process for manufacturing a flexible printed substrate using a photosensitive coverlay film of the present invention will be described. FIGS. 2(a) and 2(b) illustrate the process of laminating a photosensitive coverlay film 14 of the present invention formed in a laminated body of a PET film and a protection film to a copper-coated laminate (CCL). The process is a process for protecting the conductor surface of the CCL in which a circuit is previously formed using a conductor such as a copper foil or the like with a photosensitive dry film (coverlay film). Practically, the CCL and the photosensitive dry film (coverlay film) are conformed with each other and stuck to each other by a thermally laminating, thermally pressing, or thermally vacuum laminating method. The thermal treatment in this case is preferably carried out at a temperature at which the epoxy group or the double and triple bonds are prevented from deactivated by heat. Practically, the temperature is 180° C. or lower and preferably 150° C. or lower.

Next, FIG. 2(c) illustrates a process of radiating light to the resultant laminate body through a photomask 26 patterned in a prescribed pattern and FIG. 2(d) illustrates a process of obtaining a desired pattern by dissolving and removing unexposed parts of the coverlay film by a basic solution by developing. The developing process may be carried out using a common positive type photoresist developing apparatus.

As a developing liquid, a basic solution or an organic solvent may be used. For example, the developing liquid may be a solution containing a single compound or two or more kinds of compounds as long as the aqueous solution or the organic solvent is basic. The basic solution is generally a solution produced by dissolving a basic compound in water or an alcohol such as methanol.

The concentration of the basic compound is in general adjusted to be 0.1 to 50% by weight and preferably 0.1 to 30% by weight in terms of the effect on the supporting substrate and the likes. Meanwhile, a developer liquid may further contain an aqueous organic solvent such as methanol, ethanol, propanol, isopropyl alcohol, N-methyl-2-pyrrolidone, N,N-dimethylformamide, N,N-dimethylacetamide, and the likes in order to improve the solubility of a polyimide.

Examples of the foregoing basic compound are hydroxides, carbonates, and amine compounds of alkali metals, alkaline earth metals, and ammonium ion and more practically, the following are preferable: 2-dimethylaminoethanol, 3-dimethylamino-1-propanol, 4-dimethylamino-1-butanol, 5-dimethylamino-1-pentanol, 6-dimethylamino-1-hexanol, 2-dimethylamino-2-methyl-1-propanol, 3-dimethylamino-2,2-dimethyl-1-propanol, 2-diethylaminoethanol, 3-diethylamino-1-propanol, 2-diisopropylaminoethanol, 2-di-n-butylaminoethanol, N,N-dibenzyl-2-aminoethanol, 2-(2-dimethylaminoethoxy)ethanol, 2-(2-diethylaminoethoxy)ethanol, 1—dimethylamino-2-propanol, 1-diethylamino-2-propanol, N-methyldiethanolamine, N-ethyldiethanolamine, N-n-butyldiethanolamine, N-t-butyldiethanolamine, N-lauryldiethanolamine, 3-diethylamino-1,2-propanediol, triethanolamine, triisopropanolamine, N-methylethanolamine, N-ethylethanolamine, N-n-butylethanolamine, N-t-butylethanolamine, diethanolamine, diisopropanolamine2-aminoethanol, 3-amino-1-propanyl, 4-amino-1-butanol, 6-amino-1-hexanol, 1-amino-2-propanol, 2-amino-2,2-dimethyl-1-propanol, 1-aminobutanol, 2-amino-1-butanol, N-(2-aminoethyl)ethanolamine, 2-amino-2-methyl-1,3-propanediol, 2-amino-2-ethyl-1,3-propanediol, 3-amino-1,2-propanediol, 2-amino-2-hydroxymethyl-1,3-propanediol, sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, aminomethanol, 2-aminoethanol, 3-aminopropanol, 2-aminiopropanol, methylamine, ethylamine, propylamine, isopropylamine, dimethylamine, diethylamine, dipropylamine, diisopropylamine, trimethylamine, triethylamine, tripropylamine, triisopropylamine, and the likes. The basic compounds are not necessarily restricted to the foregoing compounds and any compound is allowable as long as it is soluble in water or an alcohol and the resultant solution has basicity.

As the developer liquid, an organic solvent can be used beside the basic solutions. In this case, organic solvents may be used solely or a mixture of a good solvent capable of well dissolving a photosensitive composition therein and a bad solvent which scarcely dissolves the photosensitive composition therein. A pattern formed by development is successively washed with a rinsing liquid to remove the developer liquid. As the rinsing liquid, suitable examples are methanol, ethanol, isopropyl alcohol, water, or the like, which has excellent miscibility with the developer liquid. The pattern obtained by the foregoing treatment is heated at a temperature of 20° C. to 200° C. to obtain a resin pattern of a photosensitive coverlay film of the present invention with a high resolution degree. The resultant resin pattern has high heat resistance and excellent mechanical properties.

Further, a solder resist of the present invention is usable for a printed wiring board using a photosensitive composition obtained in the foregoing manner. The method for using the solder resist comprises a step of applying the solder resist to a flexible printed substrate or a glass epoxy printed substrate by a screen printing or other methods. In the case of the screen printing, the solder resist is pattern-printed on a substrate by a known method and the printed substrate is heated to 80 to 120° C. for 30 to 60 minutes to remove a diluent. After that, light rays, for example, ultraviolet rays, are radiated to the resultant substrate to harden the solder resist. The ultraviolet rays having main wavelength between 1,000 to 8,000 Å are preferable and especially the ultraviolet rays having main wavelength between 2,000 to 4,000 Å are more preferable and lamps available are a low pressure mercury lamp, a middle pressure mercury lamp, a high pressure mercury lamp, an ultra high pressure mercury lamp, a xenon lamp, and the likes. Though the radiation duration depends on the composition of the photosensitive composition, the film thickness, the lamp light intensity, the distance from the light source, and the likes, for example, in the case of employing a high pressure mercury lamp with 30 $\mu$m inputting power, the exposure duration is preferably 5 to 30 seconds.

The solder resist as a protection film obtained by the foregoing treatment may be heated at a temperature selected within a range of 20° C. to 200° C. The protection film, which is a hardened material of a photosensitive composition of the present invention and formed in such a manner, has high heat resistance, excellent mechanical properties and can provide a printed wiring board having the protection film with high reliability. In addition to that, a soldering coating and gold coating can be formed in parts where no such a protection film is formed.

EXAMPLES

The present invention will be more clearly understood by referring to the examples which follow. These examples should not be construed to limit the invention in any way. In the examples, ESDA represents 2,2-bis(4-hydroxyphenyl)propane dibenzoate-3,3',4,4'-tetracarboxylic dianhydride;

6FDA represents 2,2'-hexafluoroisopropylidene diphthalic dianhydride;

BAPS-M represents bis[4-(3-aminophenoxy)phenyl]sulfone;

DMAc represents N,N-dimethylacetamide; and

DMF represents N,N-dimethylformamide.

(Glass Transition Temperature (Tg))

The glass transition temperature was measured by a differential scanning calorimeter DSC CELL SCC-41 (manufactured by Shimadzu Corp.) under a nitrogen stream at temperatures in a range of room temperature to 400° C. at a programming speed of 10° C./min.

(Weight Average Molecular Weight)

A weight average molecular weight was measured by a gel permeation chromatography (GPC) (manufactured by Waters Corp.) under following conditions.

Column: Two KD-806M manufactured by Shodex

Temperature: 60° C.

Detector: Refractive index (RI) detector

Flow rate: 1 ml/min

Developing solvent: 0.03 M of lithium bromide, and 0.03 M of phosphoric acid/DMF Concentration of sample: 0.2 wt %

Injection volume: 20 $\mu$l

Reference material: polyethylene oxide (Measurement of Imidation Ratio)

① Polyamide acid solution (DMF solution) was cast over a polyethylene terephthalate film (hereinafter referred to as "PET film"), and heated at 100° C. for 10 minutes and 130° C. for 10 minutes. After being peeled off from the PET film, the resultant film was fixed to a frame with pins and then heated at 150° C. for 60 minutes, 200° C. for 60 minutes, and 250° C. for 60 minutes. Thus, a polyimide film having a thickness of 5 $\mu$m was obtained.

② The polyamide acid solution prepared in Examples or Comparative examples (to be described later) was dissolved in DMF. The mixture was cast over a PET film and then heated at 100° C. for 30 minutes. After being peeled off from the PET film, the resultant film was fixed to a frame with pins and then dried in a vacuum oven under a reduced pressure of 670 Pa at 80° C. for 12 hours. Thus, a polyimide film having a thickness of 5 µm was prepared. An imide/benzene ring absorbance ratio was determined by measuring IR of the film. An imide/benzene ring absorbance ratio of the polyimide film prepared in ② was calculated, assuming that an imide/benzene ring absorbance ratio of the polyimide film prepared in ① is 100%. In this specification, thus-determined percentage is referred to as an imidation ratio.

Example 1

<Synthesis of Carboxy Group-Containing Polyimide)

43.05 g (0.1 mol) of BAPS-M and 300 g of DMF were placed in a 2000 ml separable flask having a stirrer. 115.3 g (0.20 mol) of ESDA was then added to the above mixture all at once with quick stirring and the stirring was continued for 30 minutes. Then a solution prepared by dissolving 15.2 g (0.1 mol) of diamino benzoic acid in 150 g of DMF was added to the mixture and stirred for 30 minutes. Thus, a polyamide acid solution was prepared. The weight average molecular weight (hereinafter referred to as "Mw") of the polyamide acid solution was 60,000. The polyamide acid solution was put into a Teflon-coated plate and then heated in a vacuum oven at 150° C. for 10 minutes, 160° C. for 10 minutes, 170° C. for 10 minutes, 180° C. for 10 minutes, 190° C. for 10 minutes, and 210° C. for 30 minutes under a reduced pressure of 670 Pa. Thus 160 g of thermoplastic polyimide containing a carboxy group was synthesized. The Mw of the polyimide was 65,000, the Tg was 190° C., and the imidation ratio was 100%.

<Synthesis of Epoxy Modified Polyimide>

33 g of the above-synthesized polyimide was dissolved in 66 g of dioxolane, and then a solution prepared by dissolving 2.85 g (25 mmol) of allyl glycidyl ether in 25 g of dioxolane was added thereto. The mixed solution was heated at 70° C. for 2 hours with stirring. Thus an epoxy modified polyimide was synthesized.

<Preparation of Photosensitive Composition (1—1 )>

To 100 g of the above epoxy modified polyimide solution was added 0.5 g of 4,4'-diaminodiphenyl sulfone (hereinafter referred to as "DDS"), 0.5 g (1.2 mmol) of bis(2,4,6-trimethyl benzoyl)-phenylphosphine oxide, 30 g of isocyanuric acid tri(ethane acrylate), and 3 g of epoxy resin Epikote 828 (available from Yuka Shell Epoxy Co.,Ltd.), and thus a photosensitive composition (1—1) was prepared.

<Production of Photosensitive Coverlay Film>

The above photosensitive composition (1—1) was applied onto a PET film and dried at 45° C. for 5 minutes. After being peeled off from the PET film, the film-like composition was fixed to a frame with pins and then dried at 65° C. for 5 minutes and at 80° C. for 30 minutes. Thus, a photosensitive polyimide coverlay film having a thickness of 35 µm was obtained.

<Production of Wiring Board>

A copper foil, the above photosensitive coverlay film, and a 50-µm-thick Teflon sheet were laid one on top of another in the order named, and laminated at 120° C. under a pressure of 1 kgf/cm. (Generally, a wiring board has a supporting substrate on the copper foil.) The laminate was then exposed to light (wavelength: 400 nm, and total light energy: 10 mJ/cm$^2$) for 3 minutes, and post baked at 100° C. for 3 minutes. After being developed in 1% tetramethyl hydroxide-methanol solution, the laminate was cured at 100° C. for 2 hours, 120° C. for 2 hours, 140° C. for 2 hours, and 160° C. for 3 hours. The adhesive strength of the copper foil and the photosensitive coverlay film of the laminate was 15 N/cm. A 100/100 µm-line/space pattern was formed. The copper foil of the laminate was removed by etching. Then the cured photosensitive coverlay film was soaked for 10 minutes in an NMP solution heated to 50° C., but it was not dissolved in the solution at all. The cured photosensitive coverlay film had a coefficient of thermal expansion of 60 ppm/° C. at temperatures in a range of room temperature to 100° C. In this specification, a coefficient of thermal expansion was evaluated by a thermal mechanical analyzer TM-120 (manufactured by Seiko Instruments Inc.) with a 10-mm distance between chucks. The evaluation was conducted under a nitrogen stream at a programming rate of 10° C./min, using a 3-mm wide test specimen and applying 3 g of load. An adhesive strength was measured in accordance with Japanese Industrial Standard JIS-6472-1955.

<Preparation of Photosensitive Composition (1-2)>

33 g of thermoplastic polyimide synthesized above was dissolved in 66 g of dioxolane, and then a solution prepared by dissolving 2.85 g (25 mmol) of allyl glycidyl ether in 25 g of dioxolane was added thereto. The mixture was heated at 70° C. for 2 hours with stirring and thus epoxy modified polyimide was synthesized. Then to 100 g of the epoxy modified polyimide solution was added a solution containing 0.5 g of DDS, 0.5 g (1.2 mmol) of bis(2,4,6-trimethyl benzoyl)-phenylphosphine oxide, 25 g of isocyanuric acid tri(ethane acrylate), 3 g of epoxy resin Epikote 828 (available from Yuka Shell Epoxy Co.,Ltd.), and 2 g of fine silica. Thus photosensitive composition (1-2) was prepared.

<Production of Printed Wiring Board>

The above-prepared photosensitive composition was screen printed on the copper foil of a glass fiber-reinforced epoxy copper clad laminate degreased in tetrachloroethane, using a patterned polyester fiber screen of 280 meshes. The printed composition was dried at 90° C. for 30 minutes, and then exposed to ultraviolet radiation twice in a 2 KW ultraviolet chamber equipped with a high-pressure mercury lamp H-2000L/S (commercially available from TOSHIBA CORPORATION). In the chamber, ultraviolet radiation was emitted from a distance of 10 cm and a conveyor speed was 0.5 m/min. Then the composition was cured at 160° C. for an hour. Thus a printed wiring board was produced. Rosin flux was applied onto a protective layer of the printed wiring board with a brush, and then soaked in a 260° C. solder bath for 10 seconds. There was no change in outward appearance and no bulge was formed thereon. The printed wiring board was subjected to a cross-cut test in accordance with JIS-D-0202. The result of the test was 100/100. A volume resistivity measured in accordance with JIS-C-2103 was 40×10$^{15}$ Ω·cm at 25° C., and 4×10$^{15}$ Ω·cm after soaking the board for 24 hours. A dielectric constant measured in accordance with JIS-C-2103 was 3.3 at 25° C., and 4.0 after soaking the board for 24 hours. A dielectric loss tangent measured in accordance with JIS-C-2103 was 0.0035 at 25° C., and 0.0050 after soaking the board for 24 hours. A breakdown voltage measured in accordance with JIS-C-2103 was 260 kV/mm at 25° C., and 200 kV/mm after soaking the board for 24 hours. No cracks could be found in the printed wiring board when it was folded 10 times horizontally.

Example 2

<Synthesis of Epoxy Modified Polyimide>

33 g of the carboxy group-containing polyimide synthesized in Example 1 was dissolved in 66 g of dioxolane, and then a solution prepared by dissolving 1.4 g (12 mmol) of glycidyl methacryl ester in 10 g of dioxolane was added thereto. The mixed solution was heated at 60° C. for 30 minutes with stirring. Then 3.4 g (12 mmol) of epoxy Adekaoptomer KRM-2110 (available from ASAHI DENKA KOGYO K.K.) was added to the solution and then heated at 60° C. for 60 minutes with stirring. Thus epoxy modified polyimide was synthesized.

<Preparation of Photosensitive Composition (2-1)>

To 100 g of the above epoxy modified polyimide solution was added 0.5 g of DDS, 0.5 g (1.2 mmol) of bis(2,4,6-trimethyl benzoyl)-phenylphosphine oxide, 30 g of isocyanuric acid tri(ethane acrylate). Thus photosensitive composition (2-1) was prepared.

<Production of Wiring Board>

Using the coverlay film produced above, a laminate was produced by the same method as described in Example 1. The laminate had an adhesive strength of 14 N/cm. A 100/100 μm-line/space pattern was formed. The copper foil of the laminate was removed by etching. Then the cured photosensitive coverlay film was soaked for 10 minutes in an NMP solution heated to 50° C., but it was not dissolved in the solution at all. The cured photosensitive coverlay film had a coefficient of thermal expansion of 65 ppm/° C. at temperatures in a range of room temperature to 100° C.

<Preparation of Photosensitive Composition (2—2)>

33 g of the thermoplastic polyimide containing carboxy group, which was synthesized in Example 1, was dissolved in 66 g of dioxolane, and then a solution prepared by dissolving 1.4 g (12 mmol) of glycidyl methacrylester in 10 g of dioxolane was added thereto. The mixture was heated at 60° C. for 30 minutes with stirring. Then 3.4 g (12 mmol) of epoxy Adekaoptomer KRM-2110 (available from ASAHI DENKA KOGYO K.K.) was added to the mixture and heated at 60° C. for 60 minutes to synthesize epoxy modified polyimide. Then with 100 g of the epoxy modified polyimide solution was evenly mixed a solution containing 0.5 g of DDS, 0.5 g (1.2 mmol) of bis(2,4,6-trimethyl benzoyl)-phenylphosphine oxide, 25 g of isocyanuric acid tri(ethane acrylate), and 2 g of fine silica. Thus photosensitive composition (2—2) was prepared.

<Production of Printed Wiring Board>

A printed wiring board was produced under the same conditions as described in Example 1. Rosin flux was applied onto a protective layer of the printed wiring board, and then soaked in a 260° C. solder bath for 10 seconds. There was no change in outward appearance and no bulge was formed thereon. The printed wiring board was subjected to a cross-cut test in accordance with JIS-D-0202. The result of the test was 100/100. A volume resistivity measured in accordance with JIS-C-2103 was $45 \times 10^{15}$ Ω·cm at 25° C., and $3.3 \times 10^{15}$ Ω·cm after soaking the board for 24 hours. A dielectric constant measured in accordance with JIS-C-2103 was 3.7 at 25° C., and 4.6 after soaking the board for 24 hours. A dielectric loss tangent measured in accordance with JIS-C-2103 was 0.0039 at 25° C., and 0.0060 after soaking the board for 24 hours. A breakdown voltage measured in accordance with JIS-C-2103 was 270 kV/m at 25° C., and 190 kV/m after soaking the board for 24 hours. No cracks could be found in the printed wiring board when it was folded 10 times horizontally.

Example 3

<Preparation of Photosensitive Composition>

To 100 g of the epoxy modified polyimide solution synthesized in Example 2 was added a solution containing 3 g of Adekaoptomer KRM-2110, 0.6 g of 4,4'-bis (diethylamino)benzophenone, 0.1 g of benzyl, 0.6 g of tribthylamine, 30 g isocyanuric acid tri(ethane acrylate), and 0.5 g of DDS. Thus a photosensitive composition was prepared.

<Production of Photosensitive Coverlay Film>

A photosensitive polyimide coverlay film was formed from the above photosensitive composition under the same conditions as described in Example 1.

<Production of Copper-Clad Wiring Board>

Using the above coverlay film, a laminate was produced by the same method as described in Example 1. The laminate had an adhesive strength of 17 N/cm. A 100/100 μm-line/space pattern was formed. The copper foil of the laminate was removed by etching. Then the cured photosensitive coverlay film was soaked for 10 minutes in an NMP solution heated to 50° C., but it was not dissolved in the solution at all. The cured photosensitive coverlay film had a coefficient of thermal expansion of 70 ppm/° C. at temperatures in a range of room temperature to 100° C.

Example 4

<Synthesis of Hydroxy Group-Containing Polyimide>

68.88 g (0.16 mol) of BAPS-M and 300 g of DMF were placed in a 2000 ml separable flask having a stirrer. 115.3 g (0.20 mol) of ESDA was added to the mixture all at once with quick stirring, and the stirring was continued for 30 minutes. Then 4.32 g (0.02 mol) of 4'4-diamino-3, 3'dihydroxybiphenyl was added to the above solution and stirred for 30 minutes. 26 g of silicon diamine 66M13 (available from PCR) was added to the mixture and stirred for 30 minutes. The polyamide acid solution was cooled in icy water for reaction. Thus, polyamide acid solution was prepared. The Mw of the polyamide acid solution was 58,000. The polyamide acid solution was put into a Teflon coated plate and then heated in a vacuum oven at 150° C. for 10 minutes, 160° C. for 10 minutes, 170° C. for 10 minutes, 180° C. for 10 minutes, 190° C. for 10 minutes, and 210° C. for 30 minutes under reduced pressure of 670 Pa. Thus 202 g of thermoplastic polyimide containing hydroxy group was synthesized. The Mw of the polyimide was 62,000, the Tg was 190° C., and the imidation ratio was 100%.

<Synthesis of Epoxy Modified Polyimide>

33 g of the above hydroxy group-containing polyimide was dissolved in 66 g of dioxolane, and then a solution prepared by dissolving 0.5 g of triethylamine and 1.0 g (7 mmol) of glycidyl methacrylate in 25 g of dioxolane was added thereto. The mixture was heated at 60° C. for two hours with stirring. Thus epoxy modified polyimide was synthesized.

<Preparation of Photosensitive Composition (4-1)>

To 100 g of the above epoxy modified polyimide solution was added 0.5 g of DDS, 0.3 g of carbonylbis[7-(dimethylamine)coumarin], 1 g of benzophenone, and 0.5 g of tributhylamine, 30 g of isocyanuric acid tri(ethane acrylate), and 3 g of epoxy resin Epikote 828 (available from Yuka Shell Epoxy Co., Ltd.) to prepare photosensitive composition (4-1).

<Production of Photosensitive Coverlay Film>

The above photosensitive composition was applied onto a PET film. By using the same method as described in Example 1, 35 μm-thick photosensitive coverlay film was produced.

<Production of Wiring Board>

Using the coverlay film produced above, a laminate was produced by using the same method as described in Example 1. The laminate had an adhesive strength of 17 N/cm. A 100/100 μm-line/space pattern was formed. The copper foil of the laminate was removed by etching. Then the cured photosensitive coverlay film was soaked for 10 minutes in an NMP solution heated to 50° C., but it was not dissolved in the solution at all. The cured photosensitive coverlay film had a coefficient of thermal expansion of 65 ppm/° C. at temperatures in a range of room temperature to 100° C.

<Preparation of Photosensitive Composition (4-2)>

33 g of the above thermoplastic polyimide was dissolved in 66 g of dioxolane, and then a solution prepared by dissolving 0.5 g of triethylamine and 1.0 g (7 mmol) of glycidyl methacrylate in 25 g of dioxolane was added thereto. The mixture was heated at 60° C. for 2 hours with stirring, and thus epoxy modified polyimide was synthesized. Then with 100 g of the epoxy modified polyimide was evenly mixed a solution containing 0.5 g of DDS, 0.3 g of 3,3'-carbonylbis[7-(dimethylamine)coumarin], 1 g of benzophenone, 0.5 g of tributhylamine, and 25 g of isocyanuric acid tri(ethane acrylate), 3 g of epoxy resin Epikote 828 (available from Yuka Shell Epoxy Co.,Ltd.), and 2 g of fine silica. Thus photosensitive composition (4-2) was prepared.

<Production of Printed Wiring Board>

A printed wiring board was produced under the same conditions as described in Example 1. Rosin flux was applied onto a protective layer of the printed wiring board, and then soaked in a 260° C. solder bath for 10 seconds. There was no change in outward appearance and no bulge was formed thereon. The printed wiring board was subjected to a cross-cut test in accordance with JIS-D-0202. The result of the test was 100/100. A volume resistivity measured in accordance with JIS-C-2103 was $50 \times 10^{15}$ Ω·cm at 25° C., and $5.3 \times 10^{15}$ Ω·cm after soaking the board for 24 hours. A dielectric constant measured in accordance with JIS-C-2103 was 3.9 at 25° C., and 4.7 after soaking the board for 24 hours. A dielectric loss tangent measured in accordance with JIS-C-2103 was 0.0045 at 25° C., and 0.0055 after soaking the board for 24 hours. A breakdown voltage measured in accordance with JIS-C-2103 was 250 kV/mm at 25° C., and 200 kV/m after soaking the board for 24 hours. No cracks could be found in the printed wiring board when it was folded 10 times horizontally.

Example 5

<Synthesis of Carboxy Group-Containing Polyimide>

64.6 g (0.15 mol) of BAPS-M and 400 g of DMF were placed in a 2000 ml separable flask having a stirrer. 115.3 g (0.20 mol) of ESDA was added to the mixture all at once with quick stirring, and the stirring was continued for 30 minutes. Then a solution prepared by dissolving 7.6 g (0.05 mol) of diamino benzoic acid was added to the above solution and stirred for 30 minutes. Thus, polyamide acid solution was prepared. The Mw of the polyamide acid solution was 60,000. 300 g of the polyamide acid solution was put into a Teflon coated plate and then heated in a vacuum oven at 150° C. for 10 minutes, 160° C. for 10 minutes, 170° C. for 10 minutes, 180° C. for 10 minutes, 190° C. for 10 minutes, and 210° C. for 30 minutes under reduced pressure of 670 Pa. Thus 85.4 g of thermoplastic polyimide containing carboxy group was synthesized. The Mw of the polyimide was 65,000, the Tg was 190° C., and the imidation ratio was 100%.

<Synthesis of Epoxy Modified Polyimide>

33 g of the above-synthesized thermoplastic polyimide was dissolved in 66 g of dioxolane, and then a solution prepared by dissolving 5.3 g (epoxy equivalent weight of 186) of epoxy resin Epikote 828 (available from Yuka Shell Epoxy Co., Ltd.) in 25 g of dioxane was added thereto. The mixture was heated at 80° C. for an hour with stirring. Thus epoxy modified polyimide was synthesized.

<Preparation of Photosensitive Composition>

To 100 g of the above epoxy modified polyimide solution was added 0.5 g of DDS, 0.5 g of 3,3',4,4'-tetra(t-buthylperoxicarbonyl)-benzophenone, 0.5 g of bis-4,4'-diethylamino benzophenone, and 30 g of isocyanuric acid tri(ethane acrylate), to prepare photosensitive composition.

<Production of Photosensitive Coverlay Film>

A photosensitive polyimide coverlay film was formed from the above photosensitive composition under the same conditions as described in Example 1.

<Production of Wiring Board>

Using the coverlay film produced above, a laminate was produced by using the same method as described in Example 1. The laminate had an adhesive strength of 14 N/cm. A 100/100 μm-line/space pattern was formed. The copper foil of the laminate was removed by etching. Then the cured photosensitive coverlay film was soaked for 10 minutes in an NMP solution heated to 50° C., but it was not dissolved in the solution at all. The cured photosensitive coverlay film had a coefficient of thermal expansion of 58 ppm/° C. at temperatures in a range of room temperature to 100° C.

Example 6

Photosensitive composition can also be prepared by using a different method as follows.

<Preparation of Photosensitive Composition>

10 g of Adekaoptomer KRM-2110 and 1 g of Adekaoptomer SP-170 were added to 100 g of the epoxy modified polyimide solution synthesized in Example 2 to prepare photosensitive composition. The composition was dropped onto a silicon wafer and spin-coated. It was then dried at 40° C. for 5 minutes, 80° C. for 5 minutes, and 120° C. for 5 minutes. Thus 5 μm-thick photosensitive polyimide film was obtained. The film was then exposed to light (wavelength: 400 nm, and total light energy: 10 mJ/cm$^2$) for 3 minutes, and post baked at 120° C. for 3 minutes. After being developed in 1% tetramethyl hydroxide methanol solution (liquid temperature of 30° C.), the film was heated at 170° C. for 4 hours. A 50/50 μm-line/space pattern was formed.

Comparative Example 1

A commercially-available flexible printed wiring board with solder resist applied thereon was ready to use. Rosin flux was applied onto a protective layer of the board with a brush and then soaked in a 260° C. solder bath for 10 seconds. There was no change in outward appearance and no bulge was formed thereon. The printed wiring board was subjected to a cross-cut test in accordance with JIS-D-0202. The result of the test was 100/100. A volume resistivity measured in accordance with JIS-C-2103 was $0.025 \times 10^{15}$ Ω·cm at 25° C., and $0.0001 \times 10^{15}$ Ω·cm after soaking the board for 24 hours. A dielectric constant measured in accordance with JIS-C-2103 was 5.5 at 25° C., and 7.6 after soaking the board for 24 hours. A dielectric loss tangent measured in accordance with JIS-C-2103 was 0.022 at 25° C., and 0.075 after soaking the board for 24 hours. A breakdown voltage measured in accordance with JIS-C-2103 was 150 kV/mm at 25° C., and 135 kV/mm after soaking the board for 24 hours. No cracks could be found in the printed wiring board when it was folded 10 times horizontally.

Comparative Example 2

A commercially-available flexible printed wiring board with solder resist applied thereon was ready to use. Rosin flux was applied onto a protective layer of the board with a brush and then soaked in a 260° C. solder bath for 10 seconds. The formation of bulges were formed thereon. The printed wiring board was subjected to a cross-cut test in accordance with JIS-D-0202. The result of the test was 100/100. A volume resistivity measured in accordance with JIS-C-2103 was $0.020 \times 10^{15}$ Ω·cm at 25° C., and 0.0001×

$10^{15}$ Ω·cm after soaking the board for 24 hours. A dielectric constant measured in accordance with JIS-C-2103 was 5.9 at 25° C., and 8.0 after soaking the board for 24 hours. A dielectric loss tangent measured in accordance with JIS-C-2103 was 0.035 at 25° C., and 0.055 after soaking the board for 24 hours. A breakdown voltage measured in accordance with JIS-C-2103 was 150 kV/m at 25° C., and 130 kV/mm after soaking the board for 24 hours. When the printed wiring board was horizontally folded 10 times, cracks were formed in the protective layer thereof.

While there has thus been described the present invention, it should be understood by those skilled in the art that various changes, modifications, and variations of the present invention can be made therein without departing from the spirit and scope of the invention.

What is claimed is:

1. An epoxy-modified polyimide comprising at least 1% by weight of a structural unit synthesized by a reaction of a polyimide with an epoxy compound, represented by the general formula (1):

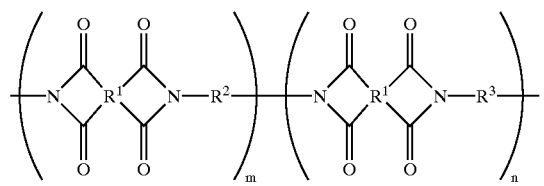

wherein $R^1$ is a tetravalent organic group; $R^3$ is a divalent organic group; and $R^2$ is a divalent organic group containing one to four organic groups selected from the group consisting of:

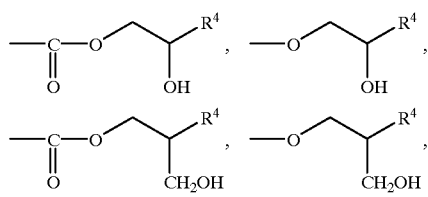

wherein $R^4$ is a monovalent organic group having at least one selected from the group consisting of an epoxy group, a carbon—carbon double bond, and a carbon—carbon triple bond; m is an integer of one or more; and n is an integer of 0 or more.

2. The epoxy-modified polyimide according to claim 1, wherein R in the general formula (1) is at least one tetravalent organic group containing one to six aromatic rings or alicyclic group.

3. The epoxy-modified polyimide according to claim 1, wherein $R^3$ in the general formula (1) is a diamine residue containing at least one of a carboxy group and a hydroxy group.

4. The epoxy-modified polyimide according to claim 1, wherein $R^1$ in the general formula (1) is a residue of an acid anhydride containing at least 10 mol % of acid dianhydride selected from the group (I) consisting of:

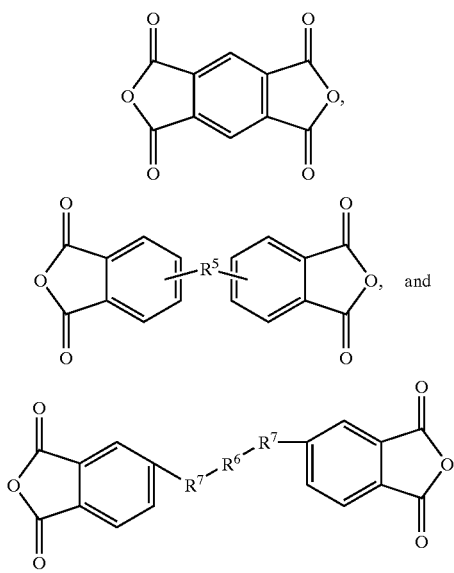

wherein $R^5$ represents —$C_6H_4$—, —$C(CF_3)_2$—, —CO—, —O—, and a single bond; $R_6$ is a divalent organic group selected from the group (II) consisting of:

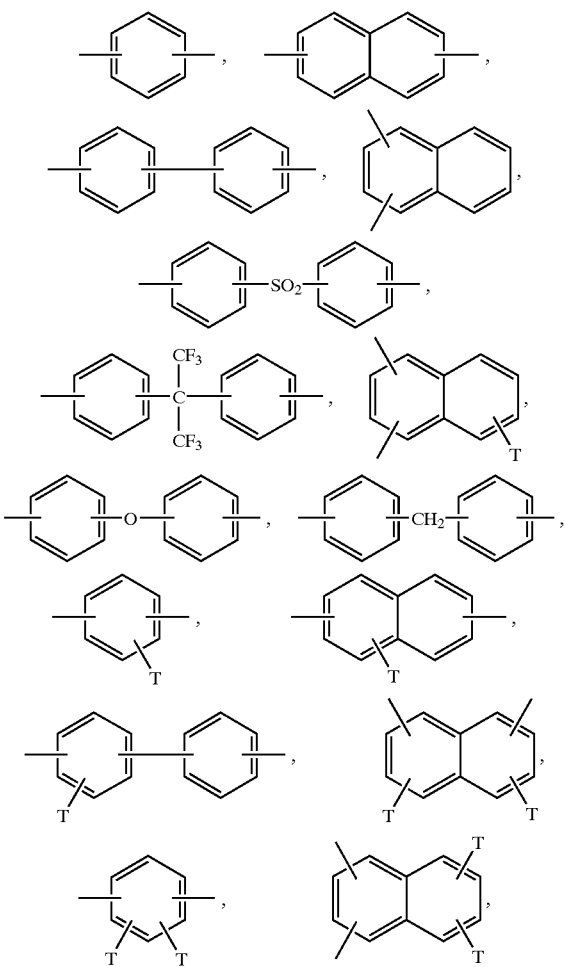

-continued

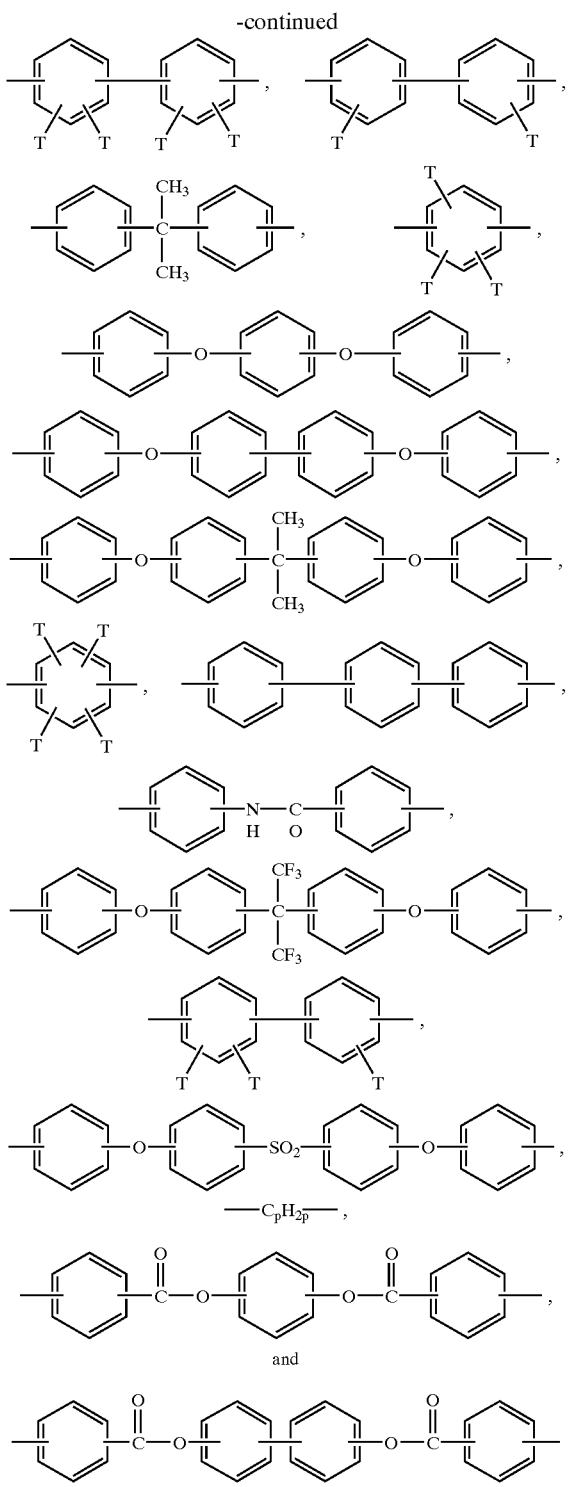

wherein $R^5$ is an integer from 1 to 20, T is one of H, F, Cl, Br, I and $CH_3O$—, and an alkyl group having 1 to 20 carbon atoms; and $R^7$ is one of —O—, —COO—, or a single bond.

5. The epoxy-modified polyimide according to claim 3, wherein $R^3$ in the general formula (1) is a residue of a diamine that is selected from the group (III) consisting of:

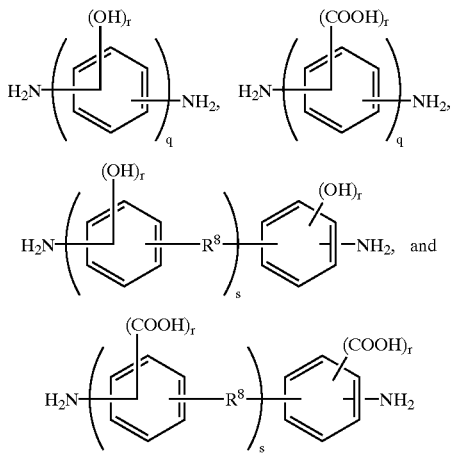

wherein q and s are an integer from 1 to 3; r is an integer from 1 to 4; and $R^8$ is a divalent organic group selected from the group consisting of —O—, —S—, —CO—, —$CH_2$—, —$SO_2$—, —$C(CH_3)_2$—, —$C(CF_3)_2$—, and —O—$CH_2$—$C(CH_3)_2$—$CH_2$—O—.

6. The epoxy-modified polyimide according to claim 1, wherein $R^3$ in the general formula (a) is a reside of a diamine that is selected from the group (IV) consisting of:

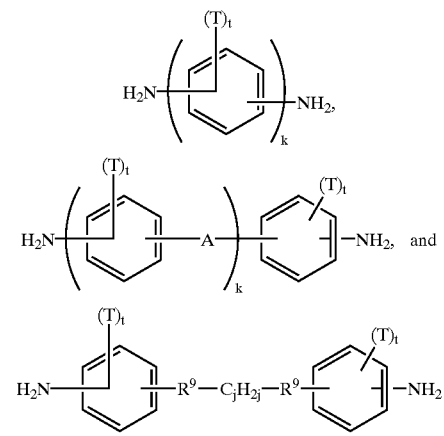

wherein T is one of H, F, Cl, Br, I, $CH_3O$—, and an alkyl group having 1 to 20 carbon atoms; A is one of —C(=O)—, —$SO_2$—, —O—, —S—, —$(CH_2)_m$—, NHCO, —$C(CH_3)_2$—, $C(CF_3)_2$, —C(=O)O—, —O—$CH_2$—$C(CH_3)_2$—$CH_2$—O—, and a bond; $R^9$ is one of —O—, —C(=O)O—, —O(O=)C—, —$SO_2$—, —C(=O)—, —S—, —$C(CH_3)_2$—, and a bond; K is an integer from 0 to 4; j is an integer from 1 to 4; and j is an integer from 1 to 20.

7. A method of producing an epoxy-modified polyimide comprising: reacting polyimide represented by the general formula (2):

General formula (2)

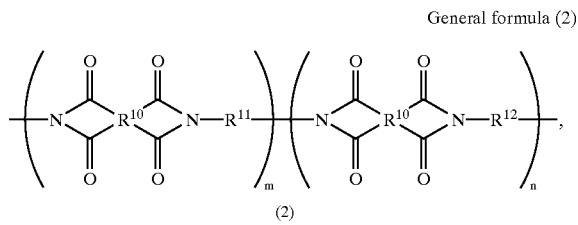

wherein $R^{10}$ is a tetravalent organic group; $R^{11}$ is a divalent organic group containing at least one of a carboxy group and a hydroxy group; $R^{12}$ is a divalent organic group; m is an integer of one or more; and n is an integer of 0 or more, with a compound selected from the group consisting of an epoxy compound containing at least two epoxy groups, a compound containing an epoxy group and a carbon—carbon double bond, and a compound containing an epoxy group and a carbon—carbon triple bond.

8. The method of producing an epoxy-modified polyimide according to claim 7, wherein a glass transition temperature of the polyimide represented by the general formula (2) is 350° C. or less.

9. The method of producing an epoxy-modified polyimide according to claim 7 or 8, further comprising: preparing polyamide acid by reacting diamine with acid dianhydride in an organic solvent when the polyimide represented by the general formula (2) is synthesized; and subsequently forming polyimide by heat drying the organic solvent solution of polyamide acid under a reduced pressure.

10. The method of producing an epoxy-modified polyimide according to claim 9, wherein the drying temperature is in a range form 80° C. to 400° C.

11. The method of producing an epoxy-modified polyimide according to claim 10, wherein the drying pressure is in a range from 0.09 to 0.0001 MPa.

12. A photosensitive composition, comprising:
(A) an epoxy modified polyimide having a structural unit represented by the general formula (1):

General formula (1)

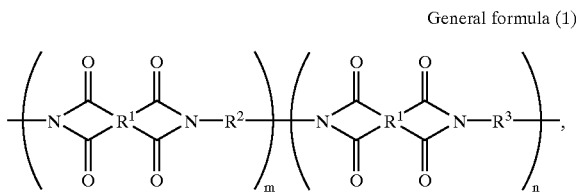

wherein $R^1$ is a tetravalent organic group; $R^3$ is a divalent organic group; and $R^2$ is a divalent organic group containing 1 to 4 organic groups selected from the group consisting of:

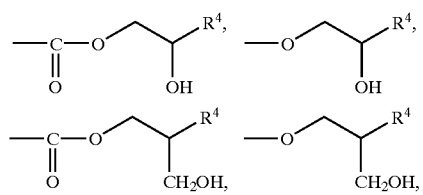

wherein $R^4$ is a monovalent organic group containing at least one selected from the group consisting of an epoxy group, a carbon—carbon double bond, and a carbon—carbon triple bond;

m is an integer of 1 or more; and
n is an integer of 0 or more, and
(B) at least one of a photoreaction initiator and a sensitizer.

13. A photosensitive composition comprising:
(A) an epoxy modified polyimide having a structural unit represented by at least the general formula (1):

General formula (1)

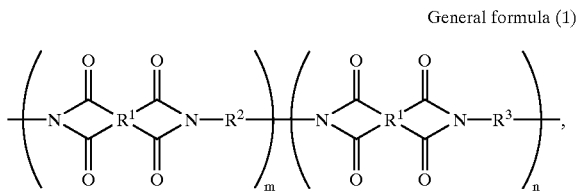

wherein $R^1$ is a tetravalent organic group; $R^3$ is a divalent organic group; and $R^2$ is a divalent organic group containing 1 to 4 organic groups selected from the group consisting of:

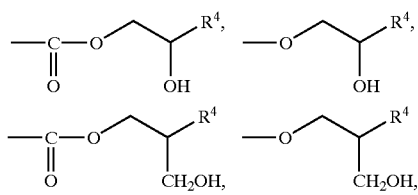

wherein $R^4$ is a monovalent organic group containing at least one selected from the group consisting of an epoxy group, a carbon—carbon double bond, and a carbon—carbon triple bond;

m is an integer of 1 or more; and
n is an integer of 0 or more,
(B) at least one of a photoreaction initiator and a sensitizer, and
(C) one of a reactive monomer or an oligomer containing a reactive carbon—carbon unsaturated bond.

14. A coverlay film consisting essentially of the photosensitive composition according to claim 12 or 13.

15. A solder resist consisting essentially of the photosensitive composition according to claim 12 or 13.

16. A printed wiring board comprising the photosensitive composition according to claim 12 or 13.

17. The printed wiring board comprising at least one of a solder plating layer and a gold plating layer onto a portion other than a protective layer made from the coverlay film according to claim 14.

18. A method for producing a printed wiring board comprising forming a protective layer by applying the photosensitive composition according to claim 12 or 13 onto a printed wiring board and photo-curing the board.

19. A method of producing a printed wiring board comprising: forming a protective layer of a solder resist by applying the photosensitive composition according to claim 12 or 13 onto a printed wiring board and photo-curing the board; and applying solder plate or gold plate onto the portion other than the protective film.

20. The printed wiring board comprising at least one of a solder plating layer and a gold plating layer onto a portion other than a protective layer made from the solder resist according to claim 15.

* * * * *